(12) United States Patent
Jeong et al.

(10) Patent No.: US 10,971,557 B2
(45) Date of Patent: Apr. 6, 2021

(54) DISPLAY DEVICE HAVING COLOR FILTER WITH SCATTERING AGENT

(71) Applicant: Samsung Display Co., Ltd., Yongin-si (KR)

(72) Inventors: Seungyeon Jeong, Hwaseong-si (KR); Ohjeong Kwon, Hwaseong-si (KR); Suk-kung Chei, Suwon-si (KR); Minju Han, Seoul (KR); Duckjong Suh, Gwangmyeong-si (KR); Bongsung Seo, Suwon-si (KR); Jaejin Lyu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 13 days.

(21) Appl. No.: 16/440,768

(22) Filed: Jun. 13, 2019

(65) Prior Publication Data
US 2020/0075682 A1    Mar. 5, 2020

(30) Foreign Application Priority Data

Aug. 28, 2018  (KR) .................. 10-2018-0101298
Nov. 22, 2018  (KR) .................. 10-2018-0145665

(51) Int. Cl.
*H01L 27/32*    (2006.01)
*G02B 5/02*     (2006.01)
(Continued)

(52) U.S. Cl.
CPC .......... *H01L 27/322* (2013.01); *G02B 5/0242* (2013.01); *G02B 5/0278* (2013.01);
(Continued)

(58) Field of Classification Search
CPC combination set(s) only.
See application file for complete search history.

(56) References Cited

U.S. PATENT DOCUMENTS 6,731,359 B1 *  5/2004  Fukaya .................. G02B 5/201
                                                    349/106
9,406,724 B2    8/2016  Choi et al.
(Continued)

FOREIGN PATENT DOCUMENTS

EP    8291324 A1      3/2018
JP    2007-33963 A    2/2007
(Continued)

OTHER PUBLICATIONS

EPO Extended Search Report dated Jan. 31, 2020, for corresponding European Patent Application No. 19193745.7 (7 pages).
(Continued)

*Primary Examiner* — Nduka E Ojeh
(74) *Attorney, Agent, or Firm* — Lewis Roca Rothgerber Christie LLP

(57) ABSTRACT

A display device includes: a display panel including an organic electroluminescent element; and a color filter on the display panel and including a plurality of color filter portions spaced from each other on a plane, wherein at least one color filter portion of the color filter portions comprises a scattering agent having an average diameter of 50 nanometers (nm) or more and 500 nm or less.

22 Claims, 16 Drawing Sheets

(51) Int. Cl.
*G02B 5/20* (2006.01)
*H01L 51/52* (2006.01)

(52) U.S. Cl.
CPC ............ *G02B 5/0294* (2013.01); *G02B 5/206* (2013.01); *H01L 27/323* (2013.01); *H01L 27/3244* (2013.01); *H01L 51/5253* (2013.01); *H01L 51/5268* (2013.01); *H01L 51/5284* (2013.01)

(56) References Cited

U.S. PATENT DOCUMENTS

| | | | |
|---|---|---|---|
| 9,887,390 | B2 | 2/2018 | Kim |
| 10,181,500 | B2 | 1/2019 | Kim |
| 2011/0042697 | A1* | 2/2011 | Lee .................... H01L 51/5268 257/89 |
| 2017/0212388 | A1 | 7/2017 | Lee et al. |
| 2017/0329175 | A1* | 11/2017 | Lee .................... G02F 1/133514 |
| 2018/0061894 | A1* | 3/2018 | Kim .................... H01L 51/5268 |
| 2018/0081476 | A1* | 3/2018 | Ma ........................ G06F 3/0416 |
| 2018/0252962 | A1* | 9/2018 | Jiang ................ G02F 1/133514 |
| 2019/0235320 | A1* | 8/2019 | Lin .................... G02F 1/133553 |
| 2020/0051959 | A1* | 2/2020 | Pschenitzka .......... H01L 33/505 |
| 2020/0073169 | A1* | 3/2020 | Jung ...................... G02B 5/201 |

FOREIGN PATENT DOCUMENTS

| | | |
|---|---|---|
| KR | 10-2016-0035680 A | 4/2016 |
| KR | 10-2017-0128729 A | 11/2017 |

OTHER PUBLICATIONS

Bathelt, R. et al.; "Light extraction from OLEDs for lighting applications through light scattering"; ScienceDirect; Organic Electronics; 8; 2007; pp. 293-299.

* cited by examiner

DISPLAY DEVICE HAVING COLOR FILTER WITH SCATTERING AGENT

CROSS-REFERENCE TO RELATED APPLICATION

The present application claims priority to and the benefit of Korean Patent Application Nos. 10-2018-0101298, filed on Aug. 28, 2018, and 10-2018-0145665, filed on Nov. 22, 2018, the entire contents of each of which are hereby incorporated by reference.

BACKGROUND

Aspects of some example embodiments of the present disclosure relate to a display device, and for example, to a display device including a color filter member for preventing or reducing reflection of external light.

Various display devices used for multimedia devices such as televisions, mobile phones, tablet computers, navigations, and game consoles are being developed. When external light is provided into the display device when using such a display device, the external light may be reflected by various components in the display panel, such as electrodes, and the display quality of the display device may be lowered.

Accordingly, some example embodiments may enable improved display quality of a display device by reducing the reflectivity of light provided from the outside.

The above information disclosed in this Background section is only for enhancement of understanding of the background and therefore it may contain information that does not constitute prior art.

SUMMARY

Aspects of some example embodiments of the present disclosure may include a display device having a relatively improved display quality according to a viewing angle while reducing the reflectance of external light.

Aspects of some example embodiments of the present disclosure may also include a display device having a relatively improved display quality by scattering external light in a color filter member (or color filter) to reduce color difference and luminance difference according to a viewing angle.

Aspects of some example embodiments of the present disclosure may also include a display device in which the reflectance due to external light is reduced while minimizing or reducing the transmittance reduction to improve the display quality difference according to the viewing angle.

According to some example embodiments of the present disclosure, a display device includes: a display panel including an organic electroluminescent element; and a color filter on the display panel and including a plurality of color filter portions spaced from each other on a plane, wherein at least one color filter portion of the color filter portions includes a scattering agent having an average diameter of 50 nm or more and 500 nm or less.

According to some example embodiments, the color filter portions may include: a first color filter portion configured to transmit light of a first wavelength range; and a second color filter portion configured to transmit light of a second wavelength range different from the first wavelength range.

According to some example embodiments, the color filter may include: a first color filter portion configured to transmit red light; and a second color filter portion configured to transmit green light, wherein the first color filter portion and the second color filter portion may include the scattering agent.

According to some example embodiments, the color filter may further include a third color filter portion, wherein the third color filter portion may include the scattering agent.

According to some example embodiments, the third color filter portion may be formed of a transparent photoresist resin.

According to some example embodiments, the third color filter portion may transmit blue light.

According to some example embodiments, a first content of the scattering agent included in the first color filter portion may be greater than or equal to a second content of the scattering agent included in the second color filter portion and a third content of the scattering agent included in the third color filter portion.

According to some example embodiments, the first content may be greater than the third content.

According to some example embodiments, a first content of the scattering agent included in the first color filter portion may be more than 0 wt % and 10 wt % or less based on a total weight of the first color filter portion.

According to some example embodiments, the scattering agent may include at least one of $TiO_2$, $ZnO$, $Al_2O_3$, $SiO_2$, hollow silica, or polystyrene particles.

According to some example embodiments, the color filter may further include an organic layer on the color filter portions, wherein the organic layer may include the scattering agent.

According to some example embodiments, a content of the scattering agent in the at least one color filter portion may be more than 0 wt % and 10 wt % or less based on the total weight of the color filter portion, wherein a content of the scattering agent in the organic layer may be 5 wt % or more and 50 wt % or less based on the total weight of the organic layer.

According to some example embodiments, the color filter may further include an organic layer on the color filter portions, and a fourth content of the scattering agent in the organic layer may be greater than each of the first to third contents.

According to some example embodiments, the color filter may further include a light blocking portion between the color filter portions.

According to some example embodiments, the display panel may further include a sealing member on the organic electroluminescent element.

According to some example embodiments, the color filter may be directly on the sealing member.

According to some example embodiments, the display device may further include an input sensor between the sealing member and the color filter, wherein the color filter may be directly on the input sensor.

According to some example embodiments, the color filter may further include an organic layer on the color filter portions.

According to some example embodiments, the color filter may further include a base substrate on the color filter portions.

According to some example embodiments, a haze value in each of the color filter portions may be 30% or less.

According to some example embodiments of the present disclosure, a display device including a red pixel region, a green pixel region, and a blue pixel region includes: a display panel; and a color filter on the display panel, wherein the color filter includes: a red color filter portion corresponding to the red pixel region; a green color filter portion corresponding to the green pixel region; and a blue color filter portion corresponding to the blue pixel region, wherein the red color filter portion and the green color filter portion include a scattering agent having an average diameter of 50 nm or more and 500 nm or less.

According to some example embodiments, the display panel may be an organic light emitting display panel including: a first light emitting layer corresponding to the red pixel region and emitting red light; a second light emitting layer corresponding to the green pixel region and emitting green light; and a third light emitting layer corresponding to the blue pixel region and emitting blue light.

According to some example embodiments of the present disclosure, a display device includes: an organic light emitting display panel; and a color filter on the organic light emitting display panel and including a red color filter portion, a green color filter portion, and a blue color filter portion, wherein each of the red color filter portion, the green color filter portion, and the blue color filter portion includes a scattering agent having an average diameter of 50 nm or more and 500 nm or less, wherein a content of the scattering agent in the red color filter portion is greater than or equal to a content of the scattering agent in each of the green color filter portion and the blue color filter portion.

According to some example embodiments of the present disclosure, a display device includes a display panel including an organic electroluminescent element; and a color filter on the display panel, wherein the color filter includes a plurality of color filter portions spaced from each other on a plane and an organic layer on the color filter portions, wherein at least one of the color filter portions and the organic layer includes a scattering agent having an average diameter of 50 nm or more and 500 nm or less.

According to some example embodiments, a content of the scattering agent in the organic layer may be greater than a content of the scattering agent in each of the color filter portions.

According to some example embodiments, the color filter may include: a first color filter portion configured to transmit red light; a second color filter portion configured to transmit green light; and a third color filter portion that is a transparent filter formed of a transparent photoresist resin or a blue filter that transmits blue light, wherein the first color filter portion, the second color filter portion, and the organic layer may include the scattering agent, and the third color filter portion may not include the scattering agent.

BRIEF DESCRIPTION OF THE FIGURES

The accompanying drawings are included to provide a further understanding of the inventive concept, and are incorporated in and constitute a part of this specification. The drawings illustrate aspects of some example embodiments of the present disclosure and, together with the description, serve to explain principles of some example embodiments of the present disclosure. In the drawings.

DETAILED DESCRIPTION

Figure 1:
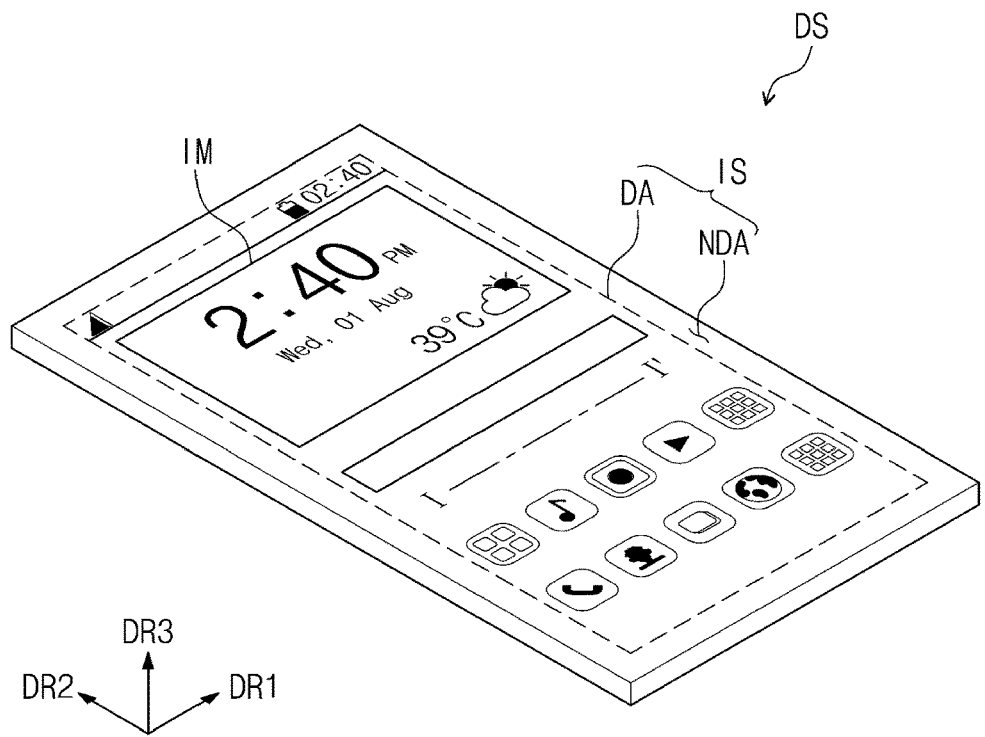
FIG. 1 is a perspective view of a display device according to some example embodiments.

Various modifications are possible in various embodiments of the inventive concept and aspects of some example embodiments are illustrated in drawings and related detailed descriptions are listed. However, this does not limit various embodiments of the inventive concept to a specific embodiment and it should be understood that the inventive concept covers all the modifications, equivalents, and/or replacements of this disclosure provided they come within the scope of the appended claims and their equivalents.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

On the other hand, terms like "directly disposed", "directly on", etc., in the present application may mean that there is no layer, film, region, plate or the like added between the portion of the layer, film, region, plate or the like and another portion. For example, "directly disposed" may mean disposing without additional members such as adhesive members between two layers or two members.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, a display device according to some example embodiments will be described with reference to the drawings.

Figure 2:
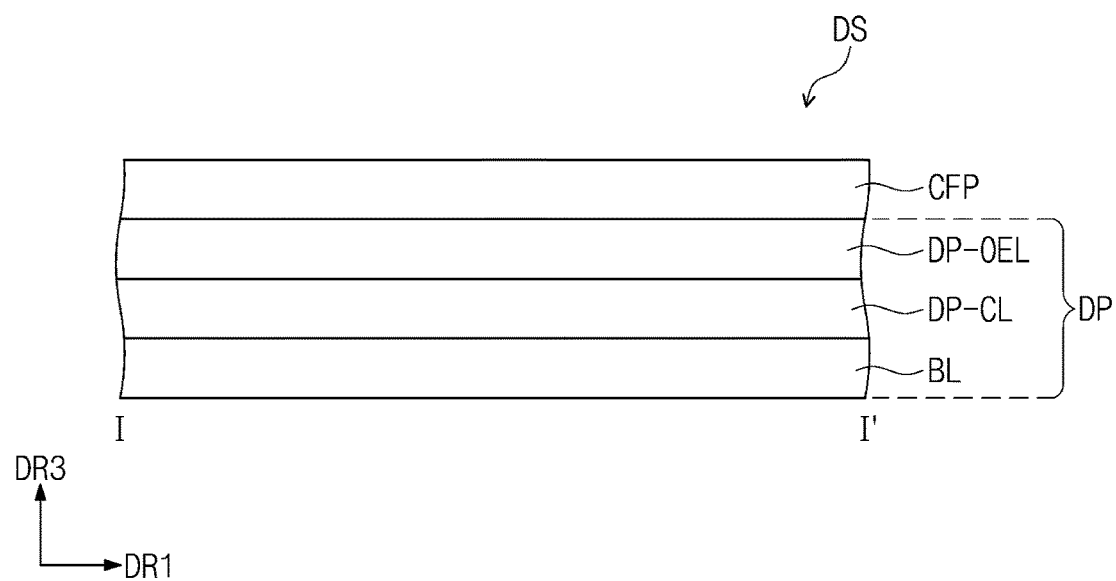
FIG. 2 is a cross-sectional view corresponding to the line I-I' of FIG. 1.
Figure 3:
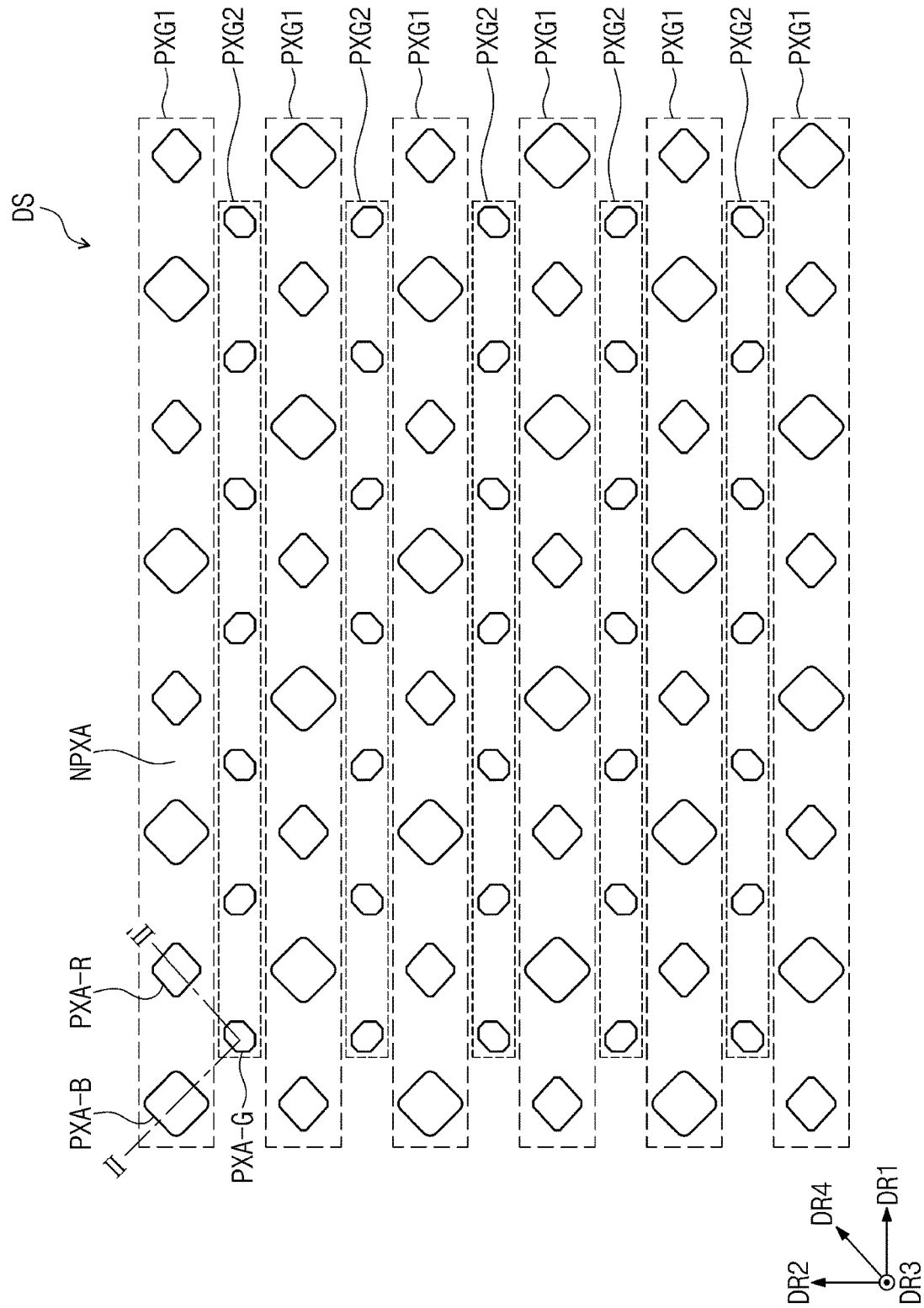
FIG. 3 is a plan view of a display panel according to some example embodiments.
Figure 4:
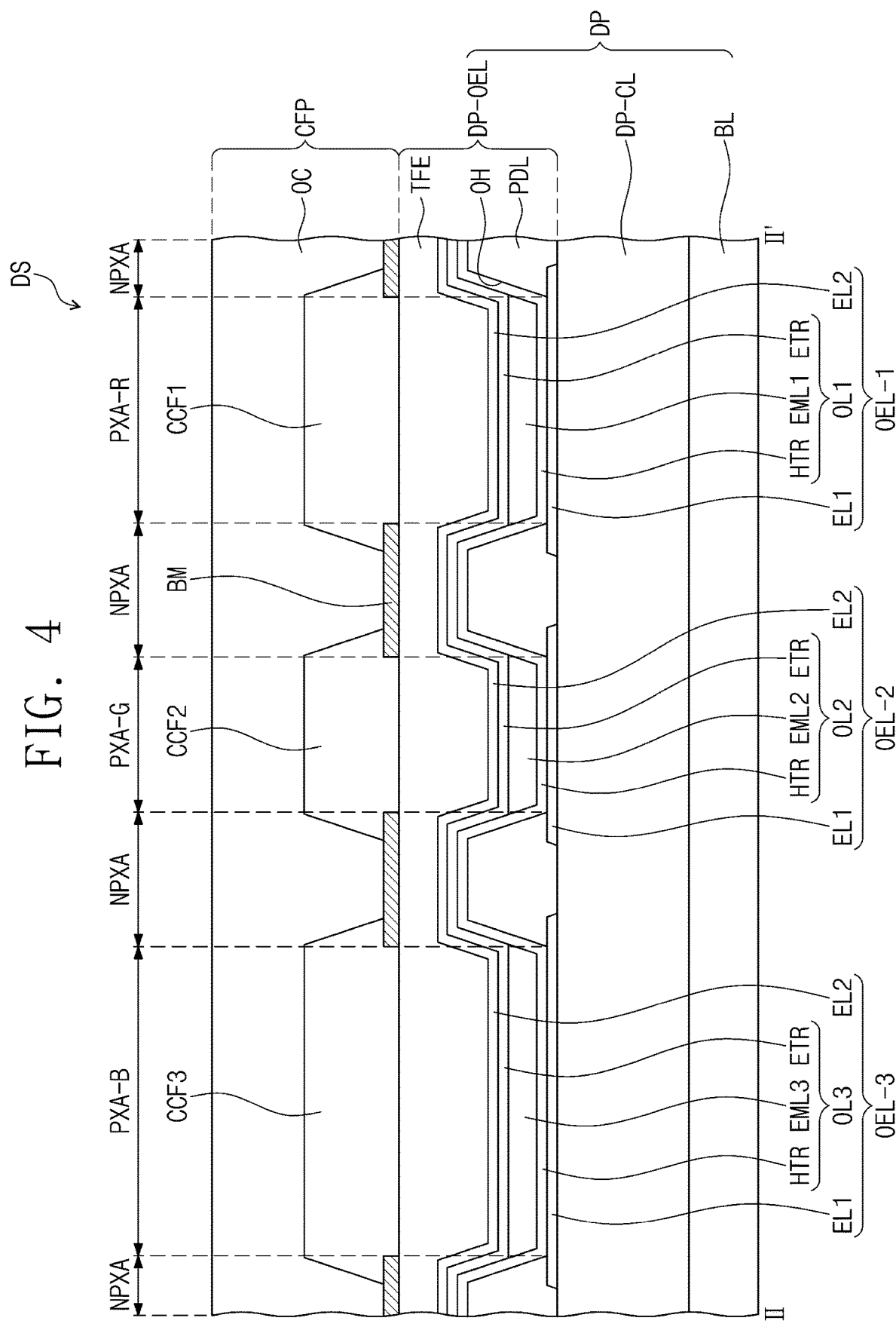
FIG. 4 is a cross-sectional view of a display device corresponding to the line II-II' of FIG. 3 according to some example embodiments.
Figure 5:
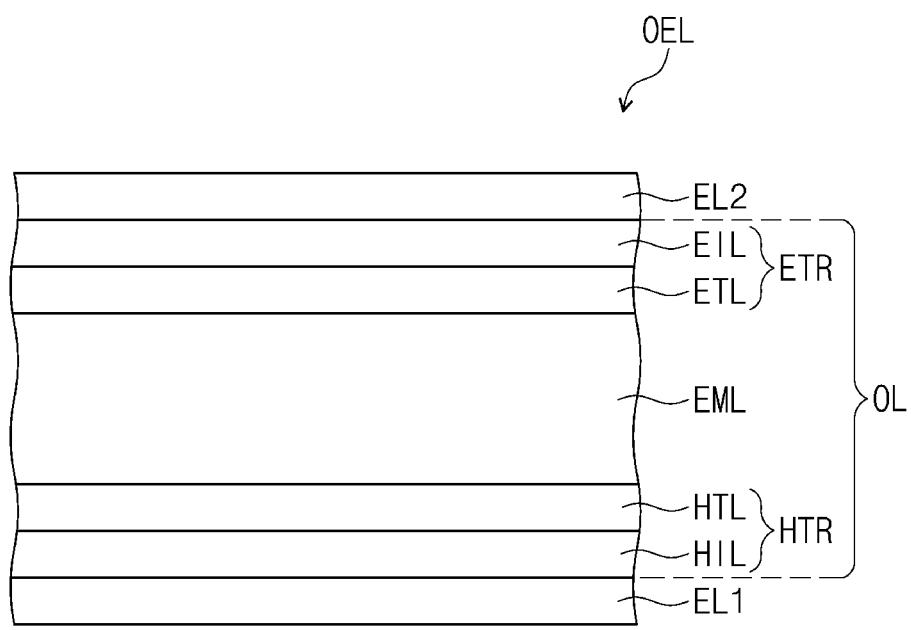
FIG. 5 is a cross-sectional view of an organic electroluminescent element according to some example embodiments.

FIG. 1 is a perspective view of a display device according to some example embodiments, and FIG. 2 is a cross-sectional view of a display device according to some example embodiments. FIG. 2 is a cross-sectional view showing a portion corresponding to the line I-I' in FIG. 1. FIG. 3 is a plan view of a display device according to some example embodiments, and FIG. 4 is a cross-sectional view showing a portion corresponding to the line II-II' in FIG. 3. FIG. 4 is a cross-sectional view of a display device according to some example embodiments. FIG. 5 is a cross-sectional view showing an example of an organic electroluminescent element included in a display device according to some example embodiments.

Referring to FIG. 1, a display device DS may display an image IM through a display surface IS. It is shown in FIG. 1 that the display plane IS is parallel to a plane defined by a first directional axis DR1 and a second directional axis DR2 intersecting the first directional axis DR1. However, this planar surface illustrated in FIG. 1 is only one example embodiment, and in other embodiments of the inventive concept, the display surface IS of the display device DS may have a curved shape.

The normal direction of the display surface IS, i.e., the thickness direction of the display device DS, is indicated by the third directional axis DR3. The front surface (or an upper surface) and the rear surface (or a lower surface) of each member are divided by the third directional axis DR3. However, the directions indicated by the first to third directional axes DR1, DR2, DR3 may be converted to other directions as relative concepts.

In FIG. 1, a portable electronic device is shown as the display device DS as an example embodiment. However, the display device DS may be used in medium-sized electronic devices such as personal computers, notebook computers, personal digital terminals, car navigation units, game machines, smart phones, tablets, and cameras in addition to large-sized electronic devices such as televisions, monitors, or external billboards. In addition, these are example embodiments and embodiments of according to the present disclosure may be employed in other electronic devices without departing from the scope of the inventive concept.

The display surface IS includes a display area DA for displaying the image IM and a non-display area NDA adjacent to the display area DA. The non-display area NDA is an area for displaying no image. In FIG. 1, a clock display window and application icons are shown as an example of the image IM.

The display area DA may be a rectangular shape. The non-display area NDA may encompass or surround the display area DA. However, embodiments according to the present disclosure are not limited thereto, and a form of the display area DA and a form of the non-display area NDA may be designed relatively. In addition, the non-display area NDA may not exist on the entire surface of the display device DS.

According to some example embodiments, the display device DS may include a display panel DP and a color filter member (or color filter) CFP located on the display panel DP. The display panel DP may include organic electroluminescent elements OEL-1, OEL-2, and OEL-3. That is, the display panel DP may be an organic light emitting display panel.

In addition, in the display device DS according to some example embodiments, the color filter member CFP may be an antireflection member that minimizes the reflection by the light provided from the outside of the display device DS. For example, the color filter member CFP may block some of the external light. The color filter member CFP is located on the display panel DP to minimize the luminance drop while reducing reflection caused by external light.

According to some example embodiments, the display panel DP may include a base layer BL, a circuit layer DP-CL provided on the base layer BL, and a display element layer DP-OEL. According to some example embodiments, the base layer BL, the circuit layer DP-CL, and the display element layer DP-OEL may be sequentially stacked in the third directional axis DR3.

The base layer BL may be a member that provides a base surface on which the display element layer DP-OEL is located. The base layer BL may be a glass substrate, a metal substrate, a plastic substrate, or the like. However, embodiments are not limited thereto, and the base layer BL may be an inorganic layer, an organic layer or a composite layer.

According to some example embodiments, the circuit layer DP-CL is located on the base layer BL, and the circuit layer DP-CL may include a plurality of transistors. Each of the transistors may include a control electrode, an input electrode, and an output electrode. For example, the circuit layer DP-CL may include a switching transistor and a driving transistor for driving the organic electroluminescent elements OEL-1, OEL-2, and OEL-3.

The display element layer DP-OEL may be one including the organic electroluminescent elements OEL-1, OEL-2, and OEL-3 and a sealing member TFE.

The sealing member TFE may be located on the organic electroluminescent elements OEL-1, OEL-2, and OEL-3. The sealing member TFE may cover the organic electroluminescent elements OEL-1, OEL-2, and OEL-3. The organic electroluminescent elements OEL-1, OEL-2, and OEL-3 may be sealed by a sealing member TFE.

FIG. 3 is an enlarged plan view of a portion of a display device DS according to some example embodiments. FIG. 4 is a cross-sectional view of a display device DS according to some example embodiments, and FIG. 4 is a cross-sectional view showing a portion corresponding to the line II-II' of FIG. 3.

Referring to FIGS. 3 and 4, the display device DS may include a non-emission area NPXA and emission areas PXA-R, PXA-G, and PXA-B. Each of the emission areas PXA-R, PXA-G, and PXA-B may be an area where light generated in each of the organic electroluminescent elements OEL-1, OEL-2, and OEL-3 is emitted. The area of each of the emission areas PXA-R, PXA-G, and PXA-B may be different from each other, and the area may mean the area when viewed in a plan view.

Each of the emission areas PXA-R, PXA-G, and PXA-B may be an area where light generated in each of the organic electroluminescent elements OEL-1, OEL-2, and OEL-3 is emitted. In the display device DS of the embodiment shown in FIGS. 3 and 4, the three emission areas PXA-R, PXA-G, and PXA-B for emitting red light, green light, and blue light are shown as examples. For example, the display device DS according to some example embodiments may include a red emission area PXA-R, a green emission area PXA-G, and a blue emission area PXA-B separated from each other.

According to some example embodiments, the display panel DP may include a plurality of organic electroluminescent elements OEL-1, OEL-2, and OEL-3 that emit light in different wavelength regions. The plurality of organic electroluminescent elements OEL-1, OEL-2, and OEL-3 may emit light of different colors. For example, according to some example embodiments, the display panel DP includes a first organic electroluminescent element OEL-1 emitting red light, a second organic electroluminescent element OEL-2 emitting green light, and a third organic electroluminescent element OEL-3 emitting blue light. However, embodiments are not limited thereto, and the first to third organic electroluminescent elements OEL-1, OEL-2, and OEL-3 may emit light of the same wavelength range, or at least one may emit light of a different wavelength range.

In the display device DS of the embodiment shown in FIGS. 3 and 4, the emission areas PXA-R, PXA-G, and PXA-B may have different areas depending on the colors emitted from the light emitting layers EML-1, EML-2, and EML-3 of the organic electroluminescent elements OEL-1, OEL-2, and OEL-3. For example, referring to FIGS. 3 and 4, in the display panel DP of the embodiment, the blue emission area PXA-B of the third organic electroluminescent element OEL-3 emitting blue light may have the largest area, and the green emission area PXA-G of the second organic electroluminescent element OEL-2 generating green light may have the smallest area. But, the embodiments are not limited thereto. The emission areas PXA-R, PXA-G, and PXA-B may emit light of colors other than red light, green light, and blue light. Alternatively, the emission areas PXA-R, PXA-G, and PXA-B may have the same area. Alternatively, the emission areas PXA-R, PXA-G, and PXA-B may be provided at different area ratios from those shown in FIG. 3.

Each of the emission areas PXA-R, PXA-G, and PXA-B may be an area separated by a pixel defining layer PDL. Non-emission areas NPXA as areas between the adjacent emission areas PXA-R, PXA-G, and PXA-B may be areas corresponding to the pixel defining layer PDL. Moreover, in the present specification, each of the emission areas PXA-R, PXA-G, and PXA-B may correspond to a pixel.

The pixel defining layer PDL may be formed of a polymer resin. For example, the pixel defining layer PDL may include a polyacrylate resin or a polyimide resin. In addition, the pixel defining layer PDL may be formed by further including an inorganic material in addition to the polymer resin. On the other hand, the pixel defining layer PDL may be formed to include a light absorbing material, or may include a black pigment or a black dye. The pixel defining layer PDL formed with a black pigment or a black dye may implement a black pixel defining layer. In forming the pixel defining layer PDL, black pigment or carbon black may be used as the black dye, but the embodiments are not limited thereto.

In addition, the pixel defining layer PDL may be formed of an inorganic material. For example, the pixel defining layer PDL may be formed of silicon nitride (SiNx), silicon oxide (SiOx), silicon oxynitride (SiOxNy), or the like. The pixel defining layer PDL may be one that defines the emission areas PXA-R, PXA-G, and PXA-B. The emission areas PXA-R, PXA-G, and PXA-B and the non-emission area NPXA may be distinguished by the pixel defining layer PDL.

The blue emission area PXA-B and the red emission area PXA-R may alternately be arranged along the first directional axis DR1 to form the first group PXG1. The green emission areas PXA-G may be arranged along the first directional axis DR1 to form the second group PXG2.

The first group PXG1 may be spaced apart from the second group PXG2 in the second directional axis DR2. Each of the first group PXG1 and the second group PXG2 may be provided in plurality. The first groups PXG1 and the second groups PXG2 may be alternately arranged along the second directional axis DR2.

One green emission area PXA-G may be spaced apart from one blue emission area PXA-B or one red emission area PXA-R in the fourth directional axis DR4. The fourth directional axis DR4 may be a direction between the first directional axis DR1 and the second directional axis DR2.

The arrangement structure of the emission areas PXA-R, PXA-G, and PXA-B shown in FIG. 3 may be referred to as a pentile structure. However, the arrangement structure of the emission areas PXA-R, PXA-G, and PXA-B in the display device DS according to the embodiments are not limited to the arrangement structure shown in FIG. 3. For example, according to some example embodiments, the emission areas PXA-R, PXA-G, and PXA-B may have a stripe structure in which a red emission area PXA-R, a green emission area PXA-G, and a blue emission area PXA-B are alternately arranged in this order along the first directional axis DR1.

Referring to FIGS. 4 and 5, each of the organic electroluminescent elements OEL-1, OEL-2, and OEL-3 included in the display device DS of the embodiment includes a first electrode EL1 and a second electrode EL2 facing each other, and organic layers OL1, OL2, and OL3 located between the first electrode EL1 and the second electrode EL2. Each of the organic layers OL1, OL2 and OL3 may include a hole transport region HTR, light emitting layers EML1, EML2, and EML3, and an electron transport region ETR.

That is, each of the organic electroluminescent elements OEL-1, OEL-2, and OEL-3 may include a first electrode EL1, a hole transport region HTR located on the first electrode EL1, light emitting layers EML1, EML2, and EML3 located on the hole transport region HTR, an electron transport region ETR located on the light emitting layer EML1, EML2, and EML3, and a second electrode EL2 located on an electron transport region ETR. The light emitting layers EML1, EML2, and EML3 may be separated by a pixel defining layer PDL.

According to some example embodiments, the organic electroluminescent elements OEL-1, OEL-2, and OEL-3 may further include at least one auxiliary layer between the first electrode EL1 and the second electrode EL2. The presence or absence of an auxiliary layer, the thickness of the auxiliary layer, and the number of auxiliary layers may vary depending on the wavelength region of the emitted light. An auxiliary layer may be an organic layer to control the resonance distance in each of the organic electroluminescent elements OEL-1, OEL-2, and OEL-3.

A sealing member TFE may be located on the organic electroluminescent element OEL, and a sealing member TFE may be located on the second electrode EL2. The sealing member TFE may be arranged directly on the second electrode EL2. The sealing member TFE may be one layer or a plurality of layers stacked. The sealing member TFE may be a thin film sealing layer. The sealing member TFE protects the organic electroluminescent elements OEL-1, OEL-2, and OEL-3. The sealing member TFE may cover the upper surface of the second electrode EL2 located in the opening OH and may fill the opening OH.

FIG. 5 is a cross-sectional view showing organic electroluminescent elements OEL-1, OEL-2, and OEL-3 included in a display panel DP according to some example embodiments. The organic electroluminescent element OEL shown in FIG. 5 illustrates an example structure of the organic electroluminescent elements OEL-1, OEL-2, and OEL-3 in FIG. 4.

The organic electroluminescent element OEL may include a first electrode EL1, a hole transport region HTR located on the first electrode EL1, a light emitting layer EML located on the hole transport region HTR, an electron transport region ETR located on the light emitting layer EML, and a second electrode (EL2) located on the electron transport region ETR. The hole transport region HTR may include a hole injection layer HIL and a hole transport layer HTL and the electron transport region ETR may include an electron injection layer EIL and an electron transport layer ETL.

The first electrode EL1 constituting the organic electroluminescent element OEL has conductivity. The first electrode EL1 may be formed of a metal alloy or a conductive compound. The first electrode EL1 may be an anode. The first electrode EL1 may be a pixel electrode.

In the organic electroluminescent element OEL according to some example embodiments, the first electrode EL1 may be a reflective electrode. However, the embodiments are not limited thereto. For example, the first electrode EL1 may be a transmissive electrode or a semi-transmissive electrode. If the first electrode EL1 is a semi-transmissive electrode or a reflective electrode, it may be formed of Ag, Mg, Cu, Al, Pt, Pd, Au, Ni, Nd, Ir, Cr, Li, Ca, LiF/Ca, LiF/Al, Mo, Ti, a compound thereof, or a mixture (for example, a mixture of Ag and Mg). Alternatively, it may have a multilayer structure including a reflective layer or a semi-transmissive layer formed of the material, and a transparent conductive layer formed of indium tin oxide (ITO), indium zinc oxide (IZO), zinc oxide (ZnO), and indium tin zinc oxide (ITZO). For example, the first electrode EL1 may be a multilayer metal film and may be a structure in which a metal film of ITO/Ag/ITO is stacked.

The hole transport region HTR may have a single layer made of a single material, a single layer made of a plurality of different materials, or a multilayer structure having a plurality of layers made of a plurality of different materials. The first hole transport region HTR may have a structure of a single layer made of a plurality of different materials or may have a structure of a hole injection layer HIL/a hole transport layer HTL, a hole injection layer HIL/a hole transport layer HTL/a buffer layer, a hole injection layer HIL/a buffer layer, a hole transport layer HTL/a buffer layer, or a hole injection layer HIL/a hole transport layer HUL/an electron blocking layer, which are sequentially stacked from the first electrode EL1. However, the embodiments are not limited thereto.

For example, the hole transport region HTR may include a hole injection layer HIL and a hole transport layer HTL, and well-known hole injecting materials and well-known hole transporting materials may be used for the hole injection layer HIL and the hole transport layer HTL, respectively.

Meanwhile, the hole transport region HTR may be located on the first electrode EL1 in the opening (OH) defined in the pixel defining layer PDL and may be arranged extending toward the upper part of the pixel defining layer PDL. However, the embodiments are not limited thereto, and the hole transport region HTR may be patterned to be located inside the opening OH.

A light emitting layer EML is provided on the hole transport region HTR. The light emitting layer EML may have a single layer of a single material, a single layer of a plurality of different materials, or a multilayer structure having a plurality of layers of a plurality of different materials.

The light emitting layer EML is not particularly limited to a commonly used material. For example, the light emitting layer EML may be formed of a material emitting red, green, and blue light, and may include a fluorescent material or a phosphorescent material. In addition, the light emitting layer EML may also include a host and a dopant. For example, referring to FIGS. 4 and 5, a light emitting layer EML may be located in an opening OH defined in a pixel defining layer PDL, but the embodiments are not limited thereto.

The electron transport region ETR is provided on a light emitting layer EML. The electron transport region ETR may include, a hole blocking layer, an electron transport layer ETL, and an electron injection layer EIL, but embodiments are not limited thereto.

When the electron transport region ETR includes an electron injection layer EIL and an electron transport layer ETL, any suitable electron injecting materials and electron transporting materials may be used for the electron injection layer EIL and the electron transport layer ETL, respectively.

The second electrode EL2 is provided on the electron transport region ETR. The second electrode EL2 may be a common electrode or cathode. The second electrode EL2 may be formed of a metal alloy or a conductive compound. The second electrode EL2 may be a transmissive electrode, a semi-transmissive electrode, or a reflective electrode. If the second electrode EL2 is a transmissive electrode, it may be formed of a transparent metal oxide such as indium tin oxide (ITO), indium zinc oxide (IZO), zinc oxide (ZnO), and indium tin zinc oxide (ITZO).

If the second electrode EL2 is a semi-transmissive electrode or a reflective electrode, it may be formed of Ag, Mg, Cu, Al, Pt, Pd, Au, Ni, Nd, Ir, Cr, Li, Ca, LiF/Ca, LiF/Al, Mo, Ti, a compound thereof, or a mixture (for example, a mixture of Ag and Mg). Alternatively, it may have a multilayer structure including a reflective layer or a semi-transmissive layer formed of the material, and a transparent conductive layer formed of indium tin oxide (ITO), indium zinc oxide (IZO), zinc oxide (ZnO), and indium tin zinc oxide (ITZO).

Referring to FIG. 4, the electron transport region ETR and the second electrode EL2 may be arranged further extending on a pixel defining layer PDL as well as a region overlapping the first electrode EL1. Meanwhile, the second electrode EL2 may be connected to the auxiliary electrode. When the second electrode EL2 is connected to the auxiliary electrode, the resistance of the second electrode EL2 may be reduced.

In the display panel DP according to some example embodiments, the first electrode EL1 among the first electrode EL1 and the second electrode EL2 facing each other may be a reflective electrode and the second electrode EL2 may be a transmissive electrode. According to some example embodiments, the organic electroluminescent element OEL may front surface light emission. However, embodiments are not limited thereto.

In FIG. 4, the display device DS may include a color filter member CFP located on the display panel DP. The color filter member CFP may include a plurality of color filter portions CCF1, CCF2, and CCF3. The color filter portions CCF1, CCF2, and CCF3 may be spaced apart from one another on a plane. The color filter portions CCF1, CCF2, and CCF3 may non-overlap each other.

Referring to FIGS. 3 and 4, the color filter portions CCF1, CCF2, and CCF3 are spaced from each other on a plane and the color filter portions CCF1, CCF2, CCF3 may be located corresponding to the emission areas PXA-R, PXA-G, and PXA-B, respectively.

According to some example embodiments, the first color filter portion CCF1 may be a red color filter portion that transmits red light, the second color filter portion CCF2 may be a green color filter portion that transmits green light, and the third color filter portion CCF3 may be a blue color filter portion that transmits blue light. Each of the color filter portions CCF1, CCF2, and CCF3 may include a polymeric photoresist resin and a pigment or dye. The first color filter portion CCF1 may include a red pigment or dye, the second color filter portion CCF2 may include a green pigment or dye, and the third color filter portion CCF3 may include a blue pigment or dye.

However, the embodiments are not limited thereto, and the third color filter portion CCF3 may not include a pigment or a dye. The third color filter portion CCF3 may include a polymeric photoresist resin and may not include pigments or dyes. The third color filter portion CCF3 may be transparent. The third color filter portion CCF3 may be formed of a transparent photoresist resin.

In the display device DS according to some example embodiments, the first color filter portion CCF1 may be arranged to correspond to the first organic electroluminescent element OEL-1, the second color filter portion CCF2 may be arranged to correspond to the second organic electroluminescent element OEL-2, and the third color filter portion CCF3 may be arranged to correspond to the third organic electroluminescent elements OEL-3. For example, the first color filter portion CCF1 may be arranged to correspond to the first light emitting layer EML1, the second color filter portion CCF2 may be arranged to correspond to the second light emitting layer EML2, and the third color filter portion CCF3 may be arranged to correspond to the third light emitting layer EML3. The first color filter portion CCF1 may correspond to the red emission area PXA-R, the second color filter portion CCF2 may correspond to a green emission area PXA-G, and the third color filter portion CCF3 may correspond to the blue emission area PXA-B.

Figure 6:
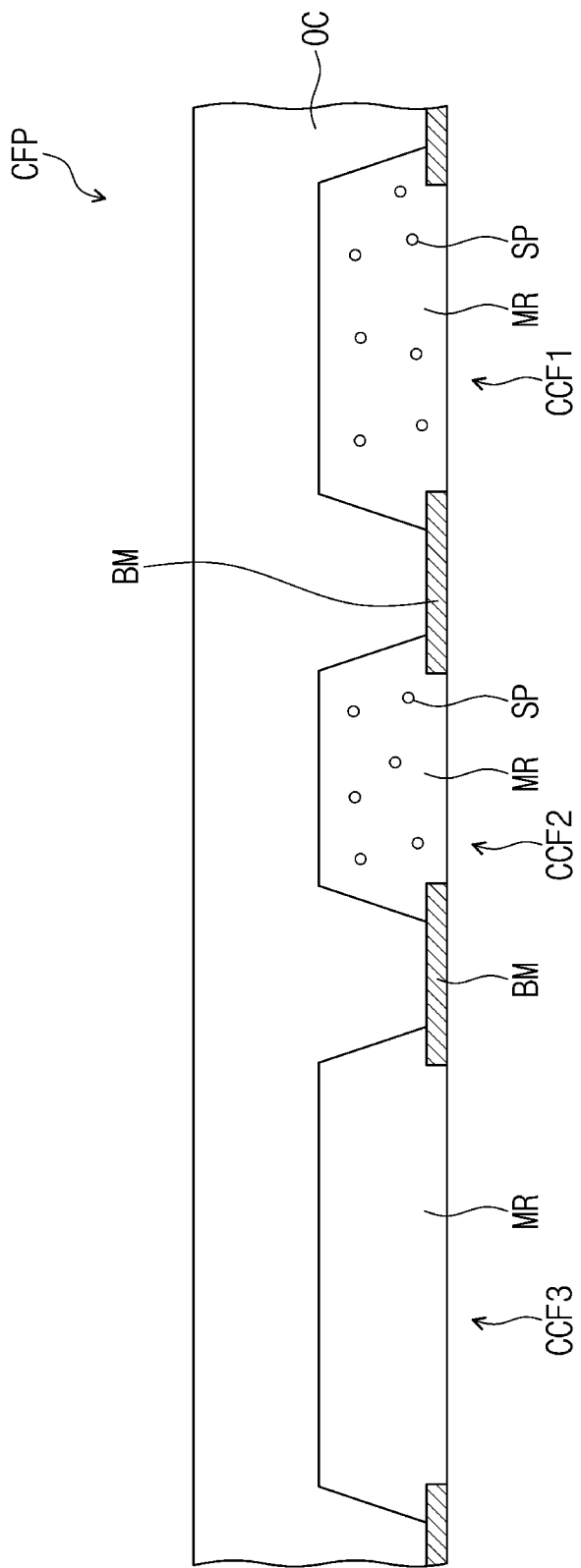
FIG. 6 is a cross-sectional view of a color filter according to some example embodiments.

FIG. 6 is a cross-sectional view of a color filter member CFP included in a display device DS according to some example embodiments. The color filter member CFP includes a plurality of color filter portions CCF1, CCF2 and CCF3 and at least one of the plurality of color filter portions CCF1, CCF2 and CCF3 includes a scattering agent SP. Referring to FIG. 6, according to some example embodiments, the first color filter portion CCF1 and the second color filter portion CCF2 may include a scattering agent SP, and the third color filter portion CCF3 may not include a scattering agent SP. Meanwhile, unlike this, according to some example embodiments, the first color filter portion CCF1 may include a scattering agent SP, and the second color filter portion CCF2 and the third color filter portion CCF3 may not include a scattering agent SP.

The color filter portions CCF1, CCF2, and CCF3 may include a matrix portion MR formed of a polymeric photoresist resin. The scattering agent SP may be scattered in the matrix portion MR. The matrix portion MR may further include a pigment or dye in addition to the polymeric photoresist resin. According to some example embodiments, the matrix portion MR of the first color filter portion CCF1 and the second color filter portion CCF2 may further include a pigment or dye, and the third color filter portion CCF3 may include a polymeric photoresist resin and may not include pigments or dyes. Meanwhile, according to some example embodiments, the third color filter portion CCF3 may include a matrix portion MR with a polymeric photoresist resin and a pigment or dye.

The scattering agent SP may include at least one of $TiO_2$, ZnO, $Al_2O_3$, $SiO_2$, hollow silica, or polystyrene particles. The scattering agent SP may include any one of $TiO_2$, ZnO, $Al_2O_3$, $SiO_2$, hollow silica, and polystyrene particles, or may be a mixture of two or more materials selected from $TiO_2$, ZnO, $Al_2O_3$, $SiO_2$, hollow silica, and polystyrene particles formed of polystyrene resin. For example, the color filter member CFP according to some example embodiments may be one including $TiO_2$ as a scattering agent SP.

Figure 7:
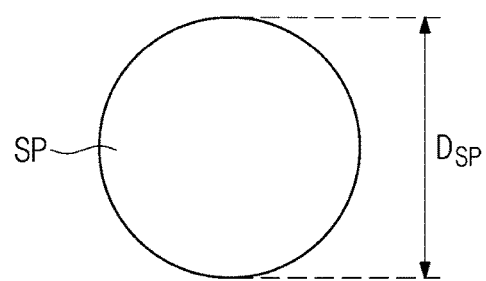
FIG. 7 is a cross-sectional view of a scattering agent according to some example embodiments.

FIG. 7 is a cross-sectional view of a scattering agent included in a color filter member according to some example embodiments. According to some example embodiments, the scattering agent SP may be spherical particles. However, example embodiments are not limited thereto, and the scattering agent SP may be elliptical or amorphous.

Referring to FIG. 7, according to some example embodiments, the cross section of the scattering agent SP may be circular. However, the embodiments re not limited thereto, and the cross section of the scattering agent SP may be elliptical or amorphous.

The average diameter of the scattering agent SP may be less than 500 nm. For example, the scattering agent SP may have an average diameter of 50 nm or more and 500 nm or less. The average diameter of the scattering agent SP may be, for example, an arithmetic average of diameters DSP in a cross section of a plurality of scattering agents SP.

When the average diameter of the scattering agent SP is less than 50 nm, in order to show the scattering effect in the color filter portions CCF1, CCF2, and CCF3, the content of the scattering agent SP is relatively increased and in this case, the transmittance in the color filter portions CCF1, CCF2, and CCF3 may be lowered. Also, when the average diameter of the scattering agent SP becomes smaller than 50 nm, in the color filter portions CCF1, CCF2, and CCF3, the change in the relative luminance value according to the viewing angle becomes larger, thereby reducing color difference according to viewing angle. Therefore, the effect of improving the display quality may not be shown.

In addition, when the average diameter of the scattering agent SP is more than 500 nm, due to the relatively large particle size, the film property may be deteriorated when the color filter portions CCF1, CCF2, and CCF3 are formed. Also, if the average diameter of the scattering agent SP is greater than 500 nm, it may be difficult to eject the resin provided at the nozzle for the formation of the color filter portions CCF1, CCF2, and CCF3 in the manufacturing process. That is, due to the large diameter of the scattering agent SP, the discharge port of the nozzle used for forming the color filter portions CCF1, CCF2, and CCF3 may be clogged.

Figure 8:
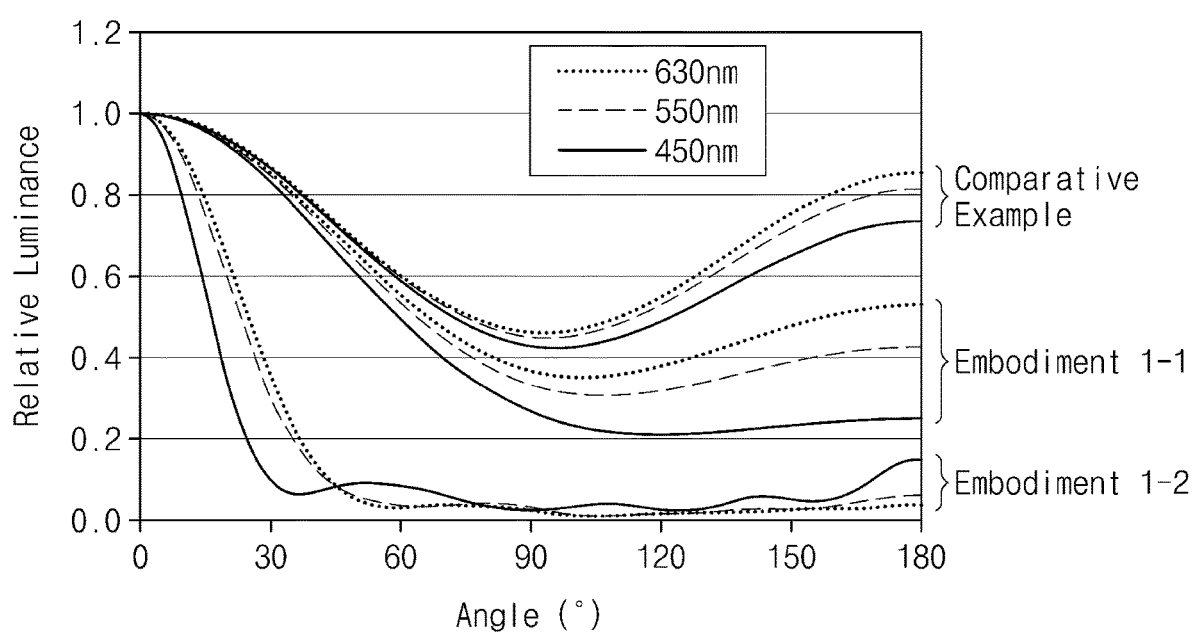
FIG. 8 is a graph showing luminance characteristics according to a viewing angle for each scattering agent size.

FIG. 8 is a graph showing wavelength-specific viewing angle characteristics according to the size of a scattering agent. In FIG. 8, the comparative example 1 is a case where the diameter of the scattering agent is 25 nm. Embodiment 1-1 is a case where the diameter of the scattering agent is 50 nm. Embodiment 1-2 is a case where the diameter of the scattering agent is 200 nm. For each of the comparative example 1, embodiment 1-1, and embodiment 1-2, the relative luminance per wavelength is shown. The luminance was evaluated at wavelengths of 450 nm, 550 nm and 630 nm. FIG. 8 shows relative luminance values in a color filter portion including a scattering agent, and the X-axis shows the viewing angle to see the color filter portion. The angle of the X axis in FIG. 8 indicates an angle of up to 180° in a clockwise or counterclockwise direction when the front surface is 0°. On the other hand, 90° or more at the viewing angle of the X axis corresponds to the rear direction with respect to the front direction with reference to 0°. The Y-axis of FIG. 8 shows a scattered luminance by a scattering agent. In addition, in FIG. 8, the Y-axis shows the relative luminance based on when the maximum luminance is 1.

Referring to FIG. 8, in a case of the comparative example 1, the diameter of the scattering agent is less than 50 nm, and when it is 90° or more in the lateral direction with respect to 0°, that is, the front, the relative luminance value due to the scattering agent is increased. This is due to back scattering caused by the scattering agent. In comparison with this, in a case of embodiment 1-1 using a scattering agent with a diameter of 50 nm, the back scattering degree at 90° or more in the lateral direction is not large compared to the comparative example. Also, in case of embodiment 1-2, compared to the comparative example and embodiment 1-1, it may be seen that back scattering is significantly reduced and the relative luminance difference between the front and side viewing angles at all wavelengths (450 nm, 550 nm, and 630 nm) is also reduced.

That is, in a case where the diameter of the scattering agent is less than 50 nm, if back scattering becomes greater, the luminance to the front side is reduced, so that the diameter of the scattering agent may be 50 nm or more. Also, it may be checked that as the diameter of the scattering agent SP increases, the difference of the luminance according to the wavelength decreases.

In other words, the color filter member CFP used in the display device DS according to some example embodiments may include a scattering agent having an average diameter of 50 nm or more to reduce the luminance difference according to the viewing angle while minimizing the front luminance decrease. Thus, the display quality difference according to the viewing angle may be improved. Further, the color filter member CFP may have a good film property including a scattering agent having an average diameter of 500 nm or less, and thus may show a good display quality.

Referring again to FIG. 6, according to some example embodiments, the color filter member CFP may further include a light blocking portion BM located between the color filter portions CCF1, CCF2, and CCF3. Referring to FIGS. 3 and 4, a plurality of color filter portions CCF1, CCF2, and CCF3 may be arranged on a plane defined by a first directional axis DR1 and a second directional axis DR2.

The light blocking portion BM may be located between the color filter portions CCF1, CCF2, and CCF3 spaced apart from each other, and may be a black matrix. The black blocking portion BM may be formed by including an organic light-shielding material or an inorganic light-shielding material including a black pigment or a dye. The light blocking portion BM may prevent light leakage and distinguish the boundary between adjacent color filter portions CCF1, CCF2, and CCF3.

On the other hand, at least a portion of the light blocking portion BM may be arranged to overlap adjacent color filter portions CCF1, CCF2, and CCF3. In other words, on a plane defined by a first directional axis DR1 and a third directional axis DR3, the light blocking portion BM may be arranged to overlap at least a portion of the color filter portions CCF1, CCF2, and CCF3 adjacent in the thickness direction.

The color filter member CFP according to some example embodiments may further include an organic layer OC. The organic layer OC may be located on the color filter portions CCF1, CCF2, and CCF3. The organic layer OC may surround the irregularities of the color filter portions CCF1, CCF2 and CCF3. That is, in the color filter member CFP according to some example embodiments, the organic layer OC may be a planarization layer. The organic layer OC may fills a gap between the color filter portions CCF1, CCF2 and CCF3 and the light blocking portion BM and may flatten the upper surface of the color filter member CFP exposed to the outside.

Moreover, although it is shown in the drawings that the organic layer OC is located above the color filter units CCF1, CCF2 and CCF3, the embodiments are not limited thereto, and the organic layer OC may be located below the color filter portions CCF1, CCF2, and CCF3. For example, the organic layer OC may be located between the display element layer DP-OEL and the color filter portions CCF1, CCF2, and CCF3.

On the other hand, the organic layer OC may be a protective layer for protecting the color filter portions CCF1, CCF2, and CCF3. The organic layer OC may be transparent. The organic layer OC may be formed of a polymer resin. On the other hand, the organic layer OC may further include a functional material in addition to the polymer resin. For example, the organic layer OC may further include functional materials such as a light absorbent, an antioxidant, and the like. Also, according to some example embodiments described in more detail later, the organic layer OC may include a scattering agent SP.

In the embodiment shown in FIG. 6, the third color filter portion CCF3, which is the portion that transmits the relatively short wavelength light among the color filter portions CCF1, CCF2 and CCF3 of the color filter member CFP, may not include the scattering agent SP. The first color filter portion CCF1 and the second color filter portion CCF2, which transmit relatively long wavelength light as compared to the third color filter portion CCF3, include a scattering agent SP to scatter the light incident on the first color filter portion CCF1 and the second color filter portion CCF2. Therefore, the display quality of the display device DS may be improved by reducing the color difference according to the viewing angle or the luminance difference according to the viewing angle.

In other words, if the resonance distances of the organic electroluminescent elements OEL-1, OEL-2, and OEL-3 are the same in the display device DS, in the first organic electroluminescent element OEL-1 and the second organic electroluminescent element OEL-2, which emit relatively long wavelength light, the luminance difference according to the viewing angle may be large. Accordingly, a scattering agent is included in the first color filter portion CCF1 and the second color filter portion CCF2 located on the first organic electroluminescent element OEL-1 and the second organic electroluminescent element OEL-2, respectively, to effectively scatter the light, so that it is possible to reduce the color luminance difference according to the viewing angle.

However, the embodiments are not limited thereto, and the third color filter portion CCF3 in the color filter member CFP according to some example embodiments may further include a scattering agent SP.

Figure 9:
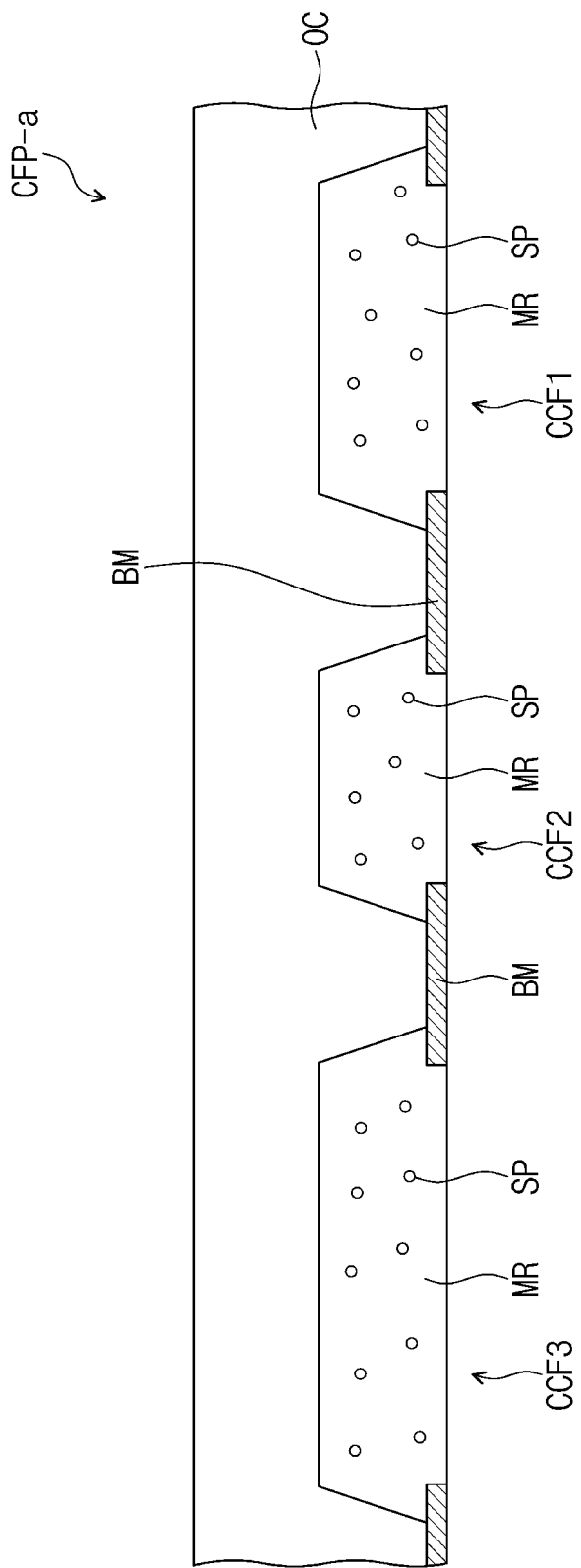
FIG. 9 is a cross-sectional view of a color filter according to some example embodiments.

FIG. 9 shows an example color filter member included in a display device according to some example embodiments, and according to some example embodiments, the color filter member CFP-a may include a plurality of color filter portions CCF1, CCF2, and CCF3. Each of the color filter portions CCF1, CCF2, and CCF3 in the color filter member CFP-a according to some example embodiments may include a scattering agent SP. In the color filter portions CCF1, CCF2, and CCF3, the scattering agent SP may be scattered in the matrix portion MR. When the color filter member CFP-a of the embodiment shown in FIG. 9 is compared with the color filter member CFP of FIG. 6 described above, there is a difference in that the third color filter portion CCF3 further includes a scattering agent SP. On the other hand, each of the color filter portions CCF1, CCF2 and CCF3 may include different kinds of scattering agents SP. Also, the content of the scattering agent SP in each of the color filter portions CCF1, CCF2, and CCF3 may be different from each other or the same, and the size of the scattering agent SP in each of the color filter portions CCF1, CCF2, and CCF3 may be different from each other or the same.

The content of the scattering agent SP included in the first to third color filter portions CCF1, CCF2, and CCF3 may be similar. The content of the scattering agent SP included in each of the first to third color filter portions CCF1, CCF2 and CCF3 may be more than 0 wt % and 10 wt % or less based on the total weight of each of the first to third color filter portions CCF1, CCF2 and CCF3. The content of the scattering agent SP included in each of the first to third color filter portions CCF1, CCF2 and CCF3 may be more than 0 wt % and 10 wt % or less based on the sum (100 wt %) of the content of the matrix portion MR and the scattering agent SP. For example, the first color filter portion CCF1, which is a red color filter portion, may include a scattering agent of more than 0 wt % and 10 wt % or less.

According to some example embodiments, the first to third color filter portions CCF1, CCF2, and CCF3 may include a scattering agent SP of more than 0 wt %, thereby reducing a color luminance difference according to a viewing angle. However, in a case where the content of the scattering agent SP exceeds 10 wt %, when forming the first to third color filter portions CCF1, CCF2, and CCF3, the scattering agent SP influences the exposure process, so that it may be difficult to manufacture the first to third color filter portions CCF1, CCF2, and CCF3.

Each of the first to third color filter portions CCF1, CCF2, and CCF3 may include a scattering agent SP in the following ratio. Table 1 below shows the front luminance rate and the WAD improvement rate for the embodiments in which the ratio of the scattering agent included in the first through third color filter portions CCF1, CCF2, and CCF3 is varied.

In Table 1, the front luminance ratio shows the reduction degree in the luminance of the display device at the front, based on a color filter portion that does not include a scattering agent. In addition, the WAD improvement rate shows the improvement degree of the color difference ($\Delta u'v'$) of the display device at the lateral all-angle with respect to the front and shows the improvement ratio of the color difference in the embodiments based on the color difference when no scattering agent is included. For example, in embodiment 1, when the front luminance of a color filter portion without a scattering agent is 100, a front luminance rate of −27% indicates a 27% reduction in luminance. Also, in embodiment 1, based on the color difference value of the color filter portion that does not include the scattering agent, the WAD improvement rate of 50% represents the reduction degree of a color difference value in embodiment 1 as a rate.

TABLE 1

| Classification | First color filter portion | Second color filter portion | Third color filter portion | Front luminance rate | WAD improvement rate |
|---|---|---|---|---|---|
| Embodiment 1 | 1.0 | 0.5 | 0.4 | −27% | 50% |
| Embodiment 2 | 1.0 | 0.8 | 0.6 | −29% | 42% |
| Embodiment 3 | 1.0 | 0.6 | 0.4 | −15% | 25% |
| Embodiment 4 | 1.0 | 1.0 | 1.0 | −18% | 15% |

When the content of the scattering agent SP included in the first color filter portion CCF1 is 1.0, in the examples of Table 1, the content of the scattering agent SP included in the second color filter portion CCF2 and the third color filter portion CCF3 is relatively shown.

Embodiment 1 is a case where the scattering agent is included at a ratio of 1:0.5:0.4 in the first color filter portion CCF1, the second color filter portion CCF2, and the third color filter portion CCF3. Embodiment 2 includes a scattering agent at a ratio of 1:0.8:0.6. Embodiment 3 is a case where the scattering agent is included at a ratio of 1:0.6:0.4. Embodiment 4 corresponds to a case where the same amount of the scattering agent is included in the first color filter portion CCF1, the second color filter portion CCF2, and the third color filter portion CCF3.

According to some example embodiments, the ratio of the content of the scattering agent included in the first color filter portion CCF1, the second color filter portion CCF2, and the third color filter portion CCF3 is 1:x:y, and at this time, x is more than 0.5 and less than 1, y is more than 0 and less than 1, and x may be more than y.

That is, the first content, which is the content of the scattering agent SP included in the first color filter portion CCF1 and the second content, which is the content of the scattering agent SP included in the second color filter portion CCF2 may be 1:0.5 to 1:1. In addition, the first content, which is the content of the scattering agent SP included in the first color filter portion CCF1 and the third content, which is the content of the scattering agent SP included in the third color filter portion CCF3 may be 1:0 to 1:1. In addition, referring to the results of Table 1, the first content, which is the content of the scattering agent SP included in the first color filter portion CCF1, and the second content, which is the content of the scattering agent SP included in the second color filter portion CCF2 may be 1:0.5 to 1:1, and the first content, which is the content of the scattering agent SP included in the first color filter portion CCF1 and the third content, which is the content of the scattering agent SP included in the third color filter portion CCF3 may be 1:0.4 to 1:1.

Meanwhile, in a case of the display device according to some example embodiments, the addition of a scattering agent to the color filter portion causes a partial reduction in front luminance, and if the reduction rate of the front luminance is less than 30%, it represents a good luminance value. Therefore, when the display device according to some example embodiments shows a luminance reduction rate of 30% or less and the WAD value is improved, it may be seen that the display quality of the display device is improved.

Again, referring to Table 1, in all embodiments, it may be seen that the luminance reduction rate is less than 30% and the WAD values are all improved. That is, in the embodiments including the scattering agent in the color filter portion, it may be checked that the display quality is improved as compared with a case where no scattering agent is included.

In addition, when referring to Table 1, from the fact that the WAD improvement rate of embodiment 1 among the embodiments is the highest, it may be seen that a case where the scattering agent is included at a ratio of 1:0.5:0.4 in the first color filter portion CCF1, the second color filter portion CCF2, and the third color filter portion CCF3 shows a more improved display quality than a case where the scattering agent is included at a ratio of 1:1:1 in the first color filter portion CCF1, the second color filter portion CCF2, and the third color filter portion CCF3.

Figure 10:
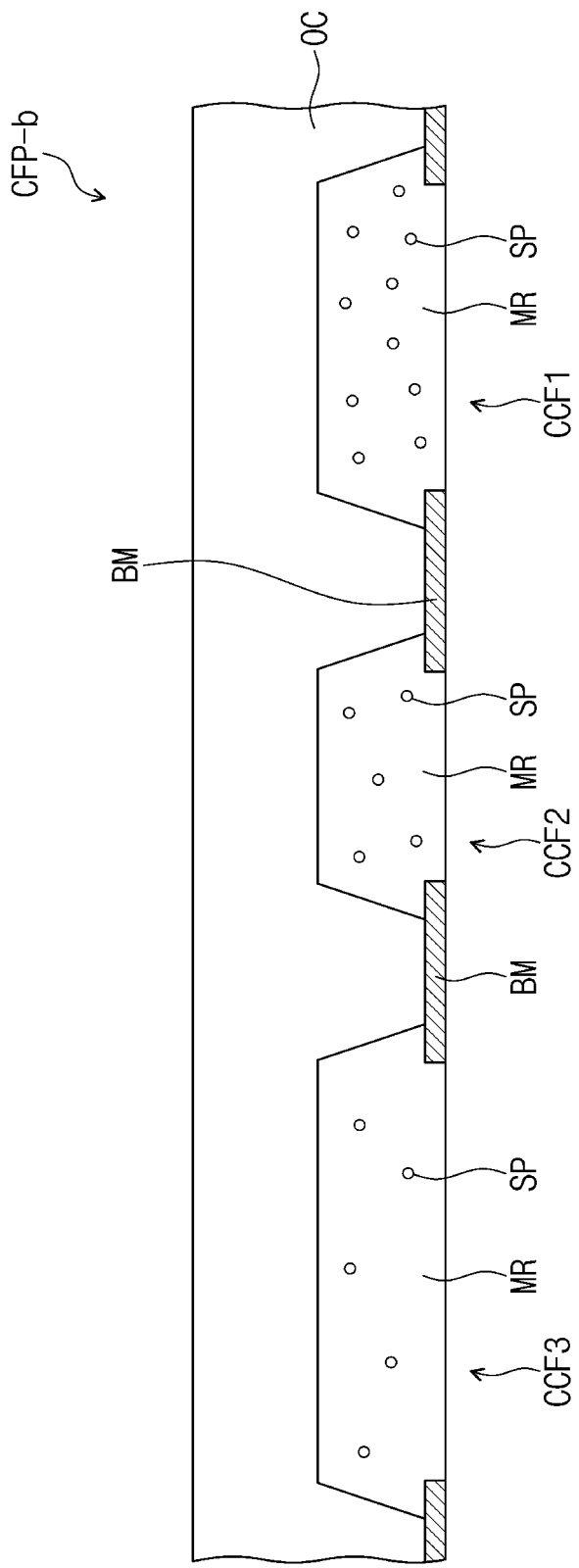
FIG. 10 is a cross-sectional view of a color filter according to some example embodiments.

FIG. 10 shows another embodiment of a color filter member included in a display device according to some example embodiments. According to some example embodiments, the color filter member CFP-b may include a plurality of color filter portions CCF1, CCF2, and CCF3. Each of the color filter portions CCF1, CCF2, and CCF3 may include a scattering agent SP. In the color filter portions CCF1, CCF2, and CCF3, the scattering agent SP may be scattered in the matrix portion MR. When the color filter member CFP-b of the embodiment shown in FIG. 10 is compared with the color filter member CFP of FIG. 6 described above, there is a difference in that the third color filter portion CCF3 further includes a scattering agent SP.

In addition, the color filter member CFP-b of the embodiment shown in FIG. 10 may correspond to a case where the contents of the scattering agent SP included in each of the first to third color filter portions CCF1, CCF2, and CCF3 are different from each other. The content of the scattering agent SP included in the first color filter portion CCF1 may be more than the content of the scattering agent SP included in the second color filter portion CCF2 and the third color filter portion CCF3.

For example, the first content of the scattering agent SP included in the first color filter portion CCF1 may be greater than the second content of the scattering agent SP included in the second color filter portion CCF2 and the third content of the scattering agent SP included in the third color filter portion CCF2. Specifically, the content of the scattering agent in the first color filter portion to the third color filter portion CCF1, CCF2, and CCF3 may have the relationship of the first content >the second content >the third content. Alternatively, the first content and the second content may be the same and the first content may be greater than the third content.

In other words, in the color filter member CFP-b according to the embodiment, the contents of the scattering agent in the first color filter portion CCF1, the second color filter portion CCF2, and the third color filter portion CCF3, which transmit light of different wavelength regions, may be different from each other. As the color filter portion that transmits relatively long wavelength light is greater, it may include a relatively large amount of scattering agent.

However, the embodiments are not limited thereto, and depending on the device structure of the first to third organic electroluminescent elements OEL-1, OEL-2, and OEL-3 used in the display device DS, the content of the scattering agent included in the first to third color filter portions CCF1, CCF2 and CCF3 may be relatively controlled.

On the other hand, the refractive index of the scattering agent SP and the refractive index of the matrix portion MR may be different from each other in the color filter portions CCF1, CCF2, and CCF3. Due to the difference in refractive index between the scattering agent SP and the matrix portion MR, the light incident on the color filter portion CCF1, CCF2, and CCF3 may be effectively scattered. The refractive index difference Δn between the scattering agent SP and the matrix portion MR may be 0.05 or more and 0.1 or less.

Figure 11:
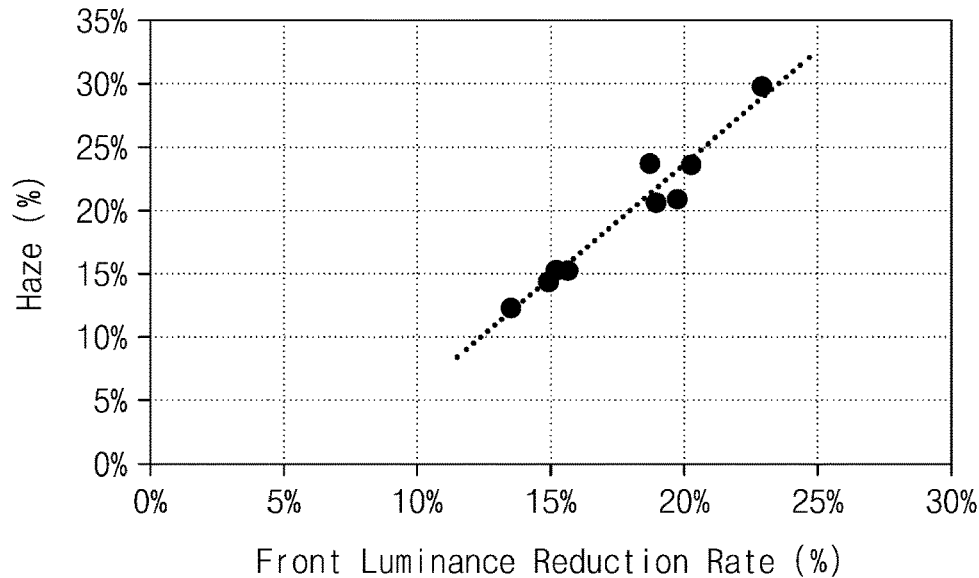
FIG. 11 is a graph showing the relationship between a front luminance and a haze value.

FIG. 11 shows the relationship between a haze and a front luminance reduction rate. That is, as the haze value increases, the front luminance reduction rate may be increased. Referring to the results of FIG. 11, the luminance reduction rate may be linearly increased with an increase in the haze value. Therefore, the haze value of the color filter member CFP may be adjusted to 30% or less in order to maintain the front luminance reduction rate at 25% or less. For example, the haze value of each of the color filter portions CCF1, CCF2, and CCF3 in the color filter member CFP according to some example embodiments may be 30% or less.

That is, the color filter portions CCF1, CCF2, and CCF3 include a scattering agent SP having an average diameter of 50 nm or more and 500 nm or less to effectively scatter the light incident on the color filter portions CCF1, CCF2, and CCF3, thereby reducing the difference in color luminance according to the viewing angle. As the color filter portions CCF1, CCF2, and CCF3 include a scattering agent SP of 10 wt % or less, the haze value may be maintained 30% or less to minimize the reduction of the front luminance.

Figure 12:
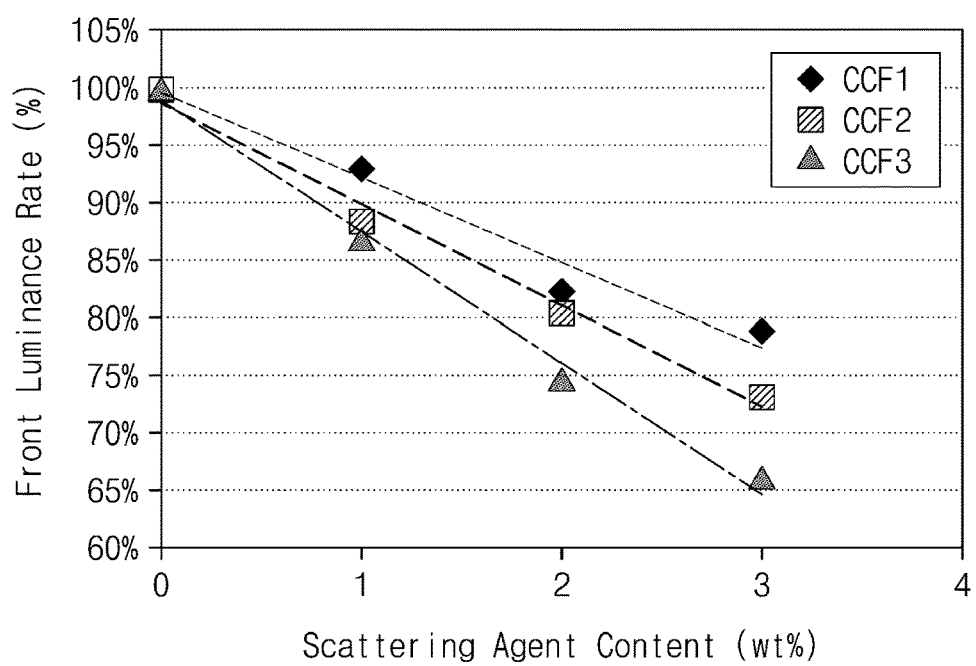
FIG. 12 is a graph showing changes in front luminance according to a scattering agent content.

FIG. 12 is a graph showing changes in front luminance rate according to the content of a scattering agent included in a color filter portion. Referring to FIG. 12, as the content of scattering agent increases, it may be seen that the front luminance rate decreases in all of the first color filter portion CCF1, the second color filter portion CCF2, and the third color filter portion CCF3. However, in a case of the first color filter portion CCF1 transmitting the light of the relatively long wavelength region, it may be seen that the front luminance rate at the same scattering agent content is higher compared with the third color filter portion CCF3. In other words, in order to show the same front luminance rate in the first to third color filter portions CCF1, CCF2, and CCF3, the content of the scattering agent included in the third color filter portion CCF3 may be adjusted to include a smaller amount than the content of the scattering agent included in the first color filter portion CCF1.

For example, in order to show a similar front luminance rate in the first to third color filter portions CCF1, CCF2, and CCF3, the content of the scattering agent included in the color filter portions CCF1, CCF2, and CCF3 may be adjusted to first content second content third content, or first content >second content >third content. Here, the first content may be the content of the scattering agent included in the first color filter portion CCF1, the second content may be the content of the scattering agent included in the second color filter portion CCF2, and the third content may be the content of the scattering agent included in the third color filter portion CCF3.

Figure 13:
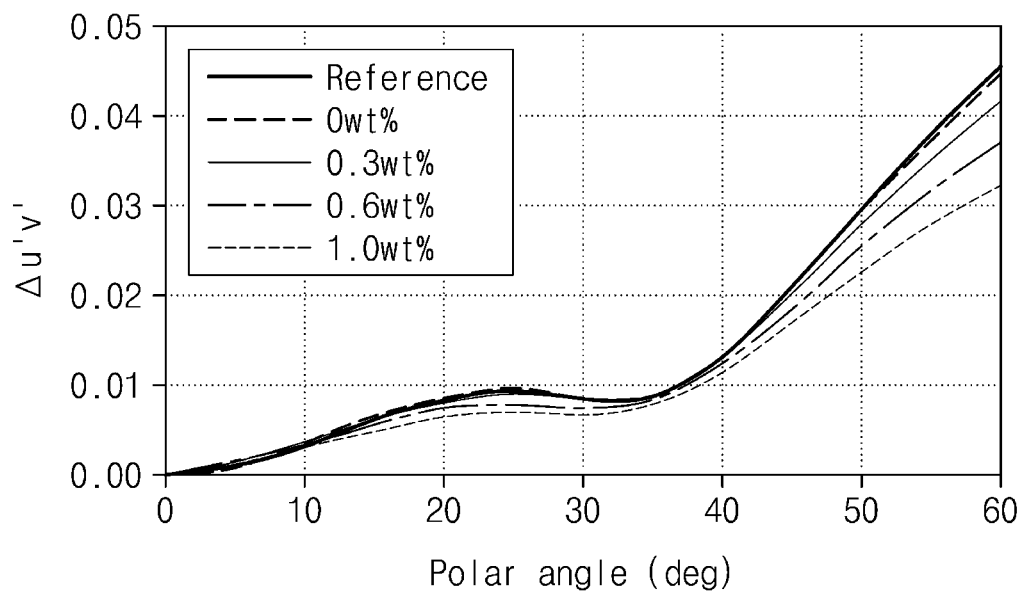
FIG. 13 is a graph showing a color difference according to a scattering agent content.
Figure 14:
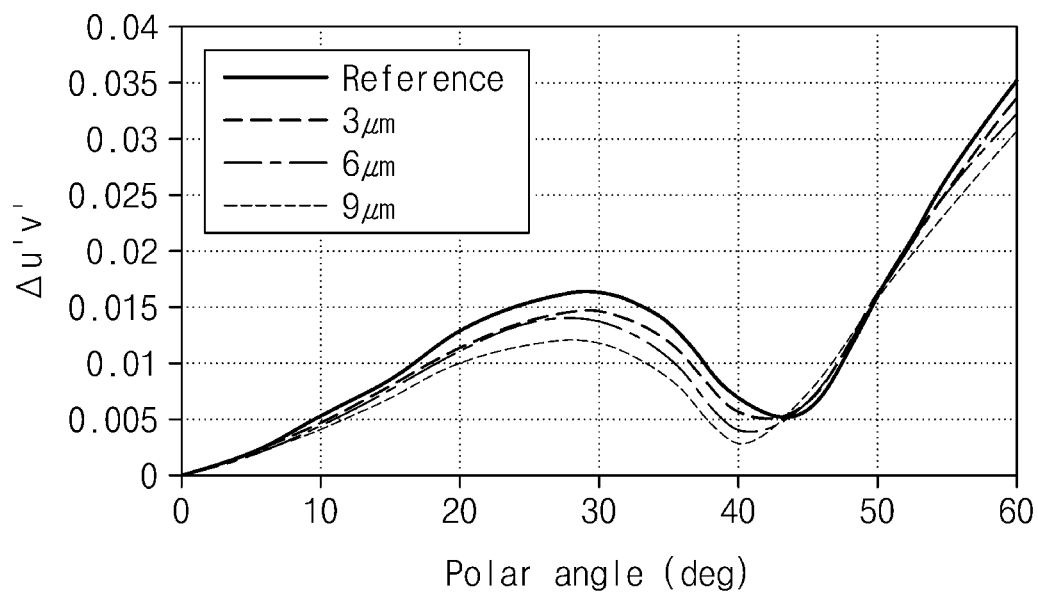
FIG. 14 is a graph showing a color difference according to the thickness of a color filter portion.

FIGS. 13 and 14 show a color difference Δu'v' according to a "Polar angle", that is, viewing angle. FIG. 13 shows a color difference in a display device according to the content of a scattering agent, and FIG. 14 shows a color difference in a display device according to the thickness of a color filter portion.

In FIG. 13, the color difference according to the viewing angle is shown according to the content of the scattering agent. In FIG. 13, "Reference" corresponds to a case where a polarizing member is used, and the remaining shows a case where scattering agents are included in the color filter portion as 0 wt %, 0.3 wt %, 0.6 wt %, and 1 wt %, respectively. That is, in FIG. 13, "Reference" is a case where a polarizing member is used instead of a color filter member in a display device, and the remaining shows a case where scattering agents are included in the color filter portion of the color filter member in the display device as 0 wt %, 0.3 wt %, 0.6 wt %, and 1 wt %, respectively. Referring to FIG. 13, it may be seen that as the content of the scattering agent increases, the color difference at the later viewing angle decreases. That is, the display device according to some example embodiments may include a scattering agent in the color filter portion to reduce the color difference at the side and the front.

In FIG. 14, the color difference according to the viewing angle is shown according to the thickness of the color filter portion. In FIG. 14, "Reference" corresponds to a case where a polarizing member is used, and the remaining shows a case where the thicknesses of the color filter portions are 3 μm, 6 μm, and 9 μm, respectively That is, in FIG. 14, "Reference" is a case where a polarizing member is used instead of a color filter member in a display device, and the remaining shows a case where the thicknesses of the color filter portion of the color filter member in the display device are 3 μm, 6 μm, and 9 μm, respectively. Referring to FIG. 14, it may be seen that as the thickness of the color filter portion increases, the color difference at the lateral viewing angle decreases. On the other hand, an increase in the thickness of the color filter portion may mean an increase in the total amount of scattering agent in the color filter portion. That is, if the content of the scattering agent included in units of volume in the color filter portion is the same, as the thickness of the color filter portion increases, the absolute amount of the scattering agent included in the color filter portion is increased. Thus, FIG. 14 shows that the scattering degree of light incident on the color filter portion increases as a total content of the scattering agent increases, thereby reducing the color difference at the side and front.

Figure 15:
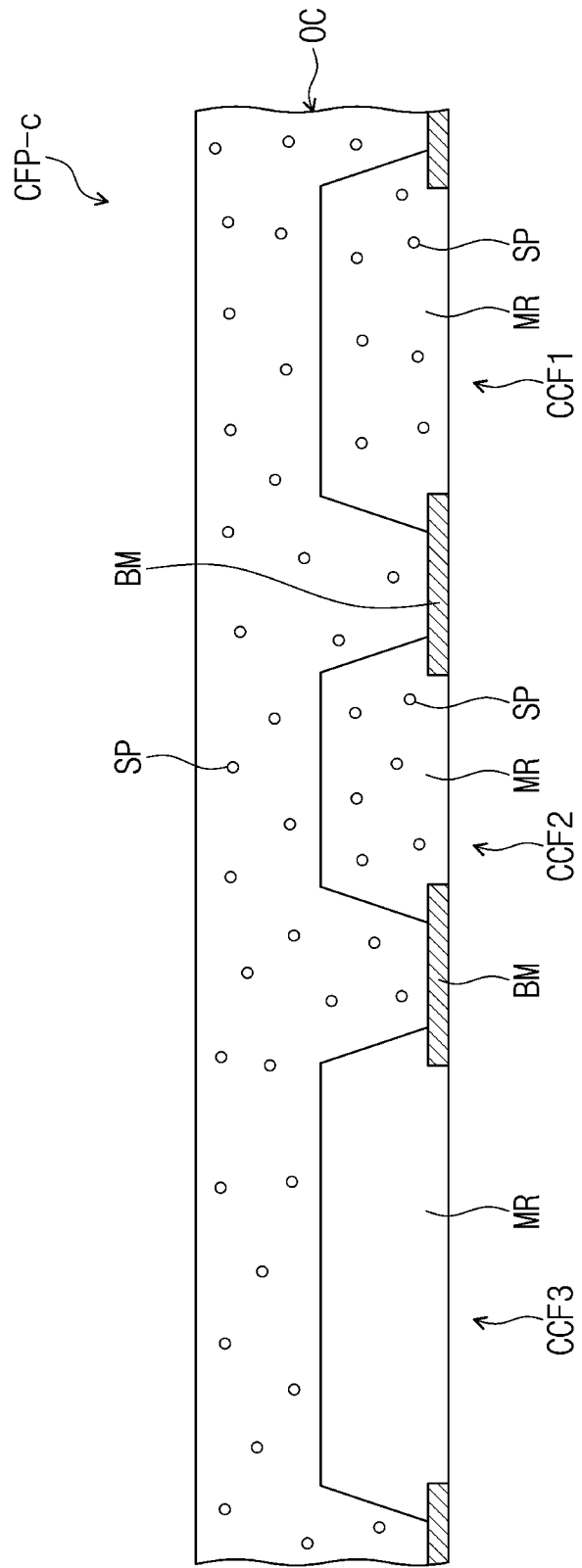
FIG. 15 is a cross-sectional view of a color filter according to some example embodiments.
Figure 16:
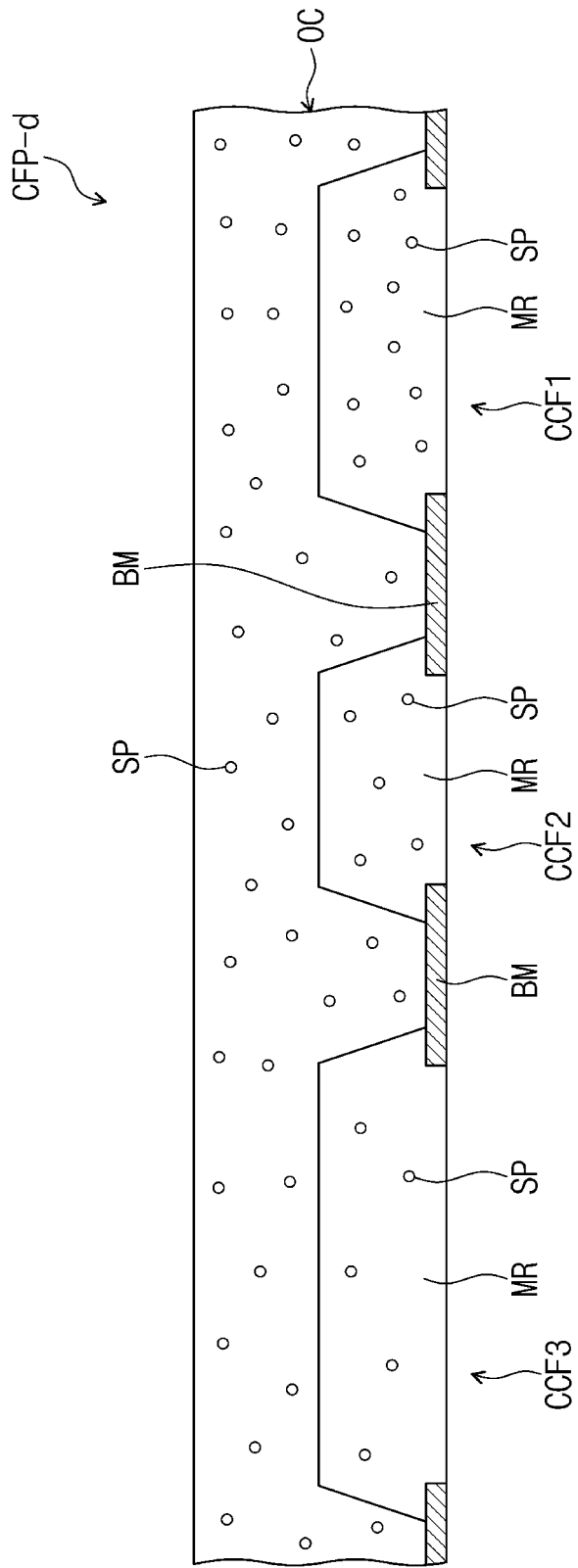
FIG. 16 is a cross-sectional view of a color filter according to some example embodiments.

FIGS. 15 and 16 are cross-sectional views of a color filter member according to each embodiment. The color filter members CFP-c and CFP-d shown in FIGS. 15 and 16 may be included in the display device DS (see FIG. 1) according to some example embodiments.

The color filter member CFP-c according to the embodiment shown in FIG. 15 has a difference in that the scattering agent SP is further included in the organic layer OC as compared with the color filter member CFP according to the embodiment shown in FIG. 6. In addition, the color filter member CFP-d according to the embodiment shown in FIG. 16 has a difference in that the scattering agent SP is further included in the organic layer OC as compared with the color filter member CFP-b according to the embodiment shown in FIG. 10. On the other hand, in the description of the color filter members CFP-c and CFP-d in the embodiment shown in FIGS. 15 and 16, the same contents as those described in FIGS. 6 and 10 may be applied to the scattering agent SP and the color filter units CCF1, CCF2 and CCF3 in addition to the face that the organic layer OC includes the scattering agent SP.

That is, the color filter members CFP-c and CFP-d according to some example embodiments may include a plurality of color filter portions CCF1, CCF2, and CCF3 and an organic layer OC located on the plurality of color filter portions CCF1, CCF2, and CCF3, and may include the scattering agent SP in at least one of the plurality of color filter portions CCF1, CCF2, and CCF3) and the organic layer OC. The average diameter of the scattering agent SP in at least one of the color filter portions CCF1, CCF2, and CCF3 and the organic layer OC may be 50 nm or more and 500 nm or less. The refractive index difference Δn between the polymer resin forming the organic layer OC and the scattering agent SP may be 0.05 or more and 0.1 or less.

In the color filter members CFP-c and CFP-d according to the embodiment, even when the content of the scattering agent SP in the color filter portions CCF1, CCF2, and CCF3 is relatively reduced by including the scattering agent SP in the organic layer OC in addition to the color filter portions CCF1, CCF2, and CCF3, it is possible to exhibit an effect of improving the difference in display quality according to the viewing angle.

In the case of the color filter members CFP-c and CFP-d according to some example embodiments, it is possible to relatively reduce the content of the scattering agent SP to be included in the color filter portions CCF1, CCF2, and CCF3 by including the scattering agent SP in the organic layer OC as compared with the case where the scattering agent SP is not included in the organic layer OC. Accordingly, it is possible to reduce the problem of non-curing of the matrix portions of the color filter portions CCF1, CCF2, and CCF3, which may occur when the color filter portions CCF1, CCF2, and CCF3 are formed according to the addition of the excessive scattering agent SP. That is, in addition to the color filter portions CCF1, CCF2, and CCF3, the organic layer OC includes the scattering agent SP such that this may exhibit the optical characteristic improving effect due to the addition of the scattering agent SP and improve the process for forming the color filter portions CCF1, CCF2, and CCF3.

On the other hand, the content of the scattering agent SP in the organic layer may be greater than the content of the scattering agent SP in the color filter portion including the scattering agent SP among the plurality of color filter portions CCF1, CCF2, and CCF3. For example, each of the plurality of color filter portions CCF1, CCF2, and CCF3 may include a scattering agent SP, and the content of the scattering agent SP in each of the color filter portions CCF1, CCF2 and CCF3 including the scattering agent SP may be greater than the content of the scattering agent SP in the organic layer OC.

According to some example embodiments, the content of the scattering agent SP in each of the color filter portions CCF1, CCF2 and CCF3 may be more than 0 wt % and less than 10 wt % based on the total weight of each of the color filter portions CCF1, CCF2, and CCF3. Also, the content of the scattering agent SP in the organic layer OC may be 5 wt % or more and 50 wt % or less based on the total weight of the organic layer OC. When the content of the scattering agent SP in the organic layer OC is less than 5 wt %, the improvement of the color difference reduction effect according to the viewing angle is not sufficient, and when the content of the scattering agent SP in the organic layer OC exceeds 50 wt %, the brightness of the display device may be reduced by the excessive content of the scattering agent SP.

In the color filter member CFP-c of the embodiment shown in FIG. 15, the first color filter portion CCF1 transmits red light and the second color filter portion CCF2 transmits green light. The third color filter portion CCF3 may be a blue filter transmitting blue light or the third color filter portion CCF3 may be a transparent filter formed of a transparent photoresist resin. Referring to FIG. 15, the first color filter portion CCF1 and the second color filter portion CCF2 include a scattering agent SP and the third color filter portion CCF3 does not include a scattering agent SP. In addition, in FIG. 15, the organic layer OC may include a scattering agent SP.

For example, the organic layer OC includes $Al_2O_3$ as a scattering agent SP, and the first color filter portion CCF1 includes ZnO as a scattering agent SP, and the second color filter portion CCF2 includes SiO2 as a scattering SP, and the third color filter portion CCF3 may not include a scattering agent. Specifically, the organic layer OC contains 30 wt % of $Al_2O_3$ having an average diameter of 300 nm with respect to the total weight of the organic layer. The first color filter portion CCF1 includes 8.5 wt % of ZnO having an average diameter of 400 nm with respect to the total weight of the first color filter portion. The second color filter portion CCF2 may include 5 wt % of $SiO_2$ having an average diameter of 200 nm with respect to the total weight of the second color filter portion. On the other hand, the kind of the scattering agent, the average diameter of the scattering agent, and the content of the scattering agent are only examples, and the types and contents of the scattering agent may be variously combined within the scope of the inventive concept.

FIG. 16 is a view showing a color filter member CFP-d in which the contents of the scattering agent SP included in each of the first to third color filter portions CCF1, CCF2 and CCF3 are different from each other, and the organic layer OC includes the scattering agent SP. For example, the first content of the scattering agent SP in the first color filter portion CCF1 may be greater than the second content of the scattering agent SP in the second color filter portion CCF2 and the third content of the scattering agent SP in the third color filter portion CCF3 portion. Specifically, the content of the scattering agent in the first color filter portion to the third color filter portion CCF1, CCF2, and CCF3 may have the relationship of the first content >the second content >the third content. Alternatively, the first content and the second content may be the same and the first content may be greater than the third content.

On the other hand, the fourth content of the scattering agent SP in the organic layer OC is greater than the first to third contents of the first to third color filter portions CCF1, CCF2, and CCF3, and for example, this may have the relationship of the first content >the second content >the third content >the fourth content.

Meanwhile, although FIG. 16 shows a case where the contents of the scattering agent SP in the first to third color filter portions CCF1, CCF2, and CCF3 are different, the embodiments are not limited thereto. The content of the scattering agent SP in the first to third color filter portions CCF1, CCF2, and CCF3 may be the same. Even in this case, the content of the scattering agent SP in the organic layer OC may be greater than the content of the scattering agent in each of the first color filter portion to the third color filter portion CCF1, CCF2, and CCF3.

Figure 17:
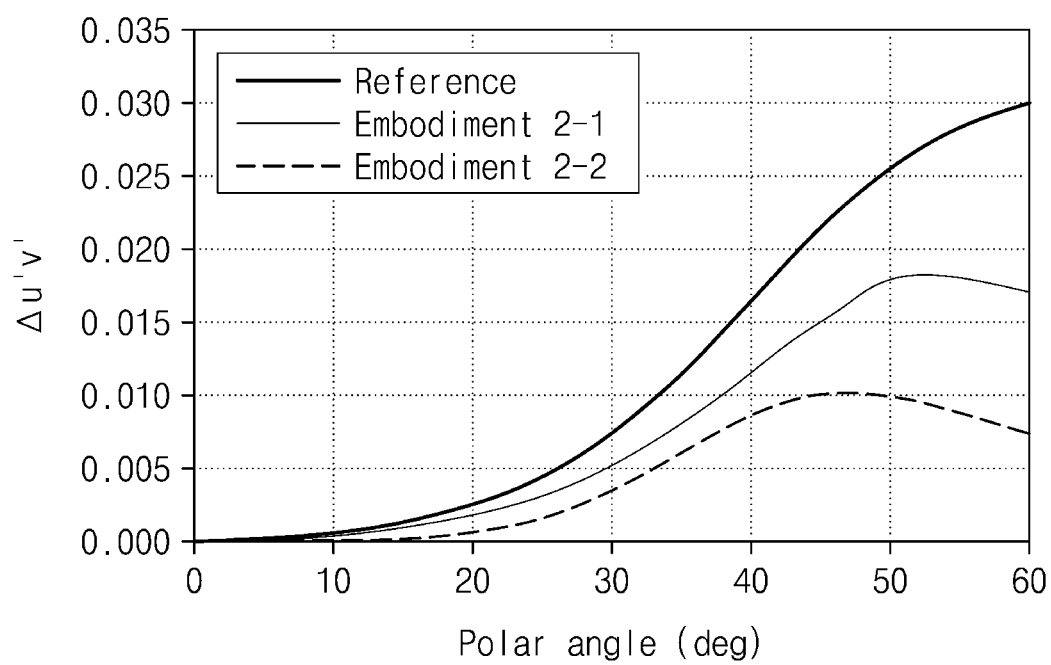
FIG. 17 is a graph showing a color difference according to a viewing angle.

FIG. 17 shows a color difference $\Delta u'v'$ according to "Polar angle", that is, a viewing angle. In FIG. 17, "Reference" corresponds to the case where a polarizing member is used. In embodiment 2-1, a scattering agent is included only in the color filter portion. Embodiment 2-2 shows the case where the color filter portions and the organic layer include a scattering agent. Embodiment 2-1 shows the case where the first color filter portion CCF1 contains 3.9 wt % of a scattering agent SP, the second color filter portion CCF2 contains 1.9 wt % of a scattering agent SP, and the third color filter portion CCF3 contains 1.4 wt % of a scattering agent SP. Embodiment 2-2 corresponds to a case where to a scattering agent SP of 5.2 wt % is additionally included in the organic layer OC in embodiment 2-1.

Referring to FIG. 17, it may be seen that the color difference at the side viewing angle is reduced in embodiments 2-1 and 2-2 as compared with "Reference". In addition, it may be seen that Example 2-2 exhibits improved viewing angle characteristics compared to Example 2-1.

In the display device DS of the embodiment described with reference to FIGS. 1 to 10, the color filter member CFP may be located directly on the display panel DP. Further, the color filter member CFP may be located directly on the sealing member TFE. On the other hand, the display device DS according to some example embodiments may include a color filter member CFP and may not include a polarizing member.

That is, the display device DS of the above-described embodiment may arrange the color filter member CFP on the display panel DP to reduce the reflection by the external light, so that it is possible to improve a display quality. Also, the display device DS according to some example embodiments includes a color filter member CFP on the display panel DP and does not include a polarizing member to reduce the reflection by external light while minimizing the luminance reduction, so that it is possible to display a good display quality. Also, the display device DS according to some example embodiments includes a scattering agent having an average diameter of 50 nm or more and 500 nm or less in the color filter member CFP to effectively scatter the light incident on the color filter member CFP and thus, reduce the color difference according to the viewing angle. The display device DS may maintain the luminance value to be 85% or more by maintaining the haze value to be 30% or less.

Figure 18:
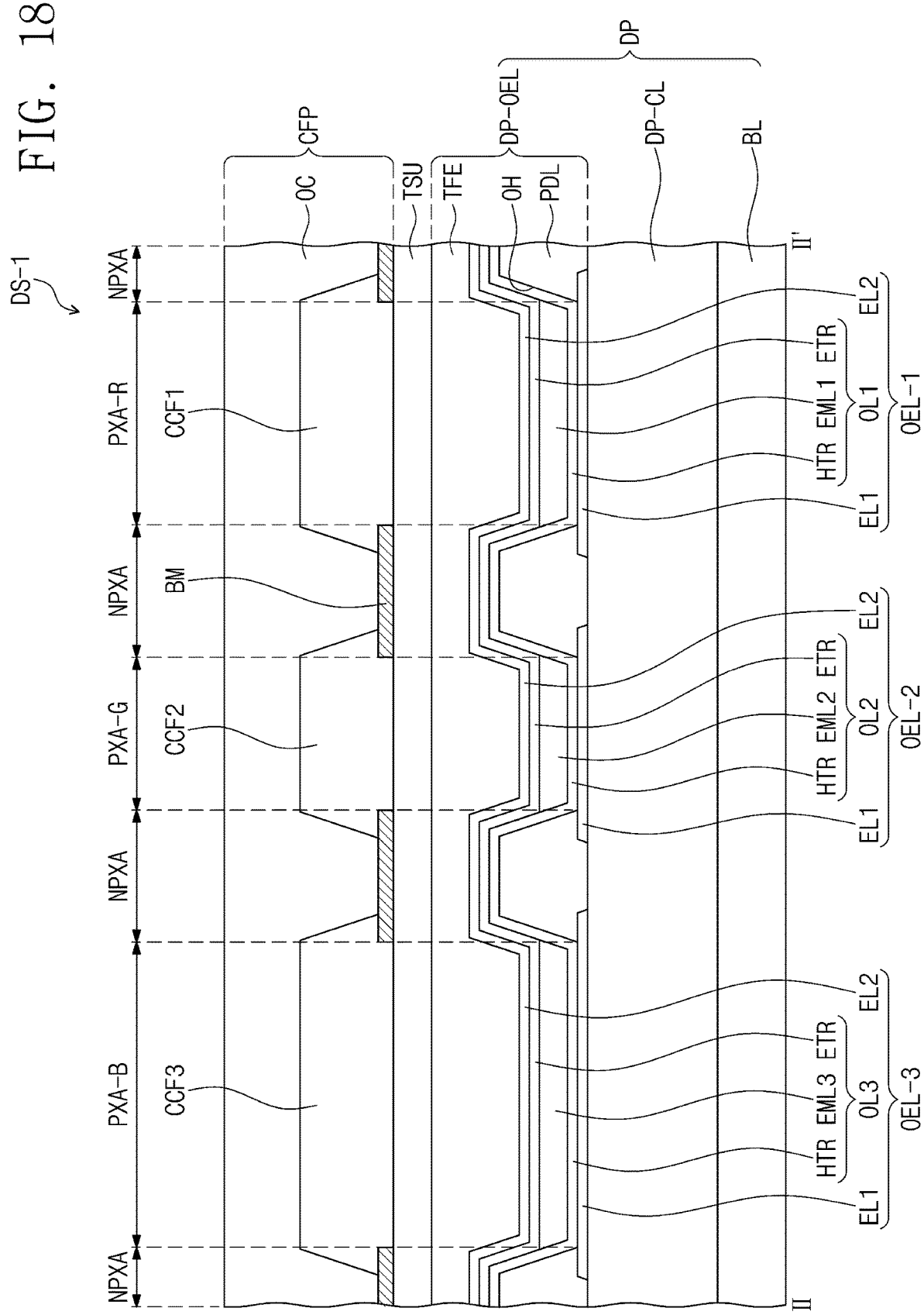
FIG. 18 is a cross-sectional view of a display device according to some example embodiments.

FIG. 18 is a cross-sectional view showing a display device according to some example embodiments. The display device DS-1 according to some example embodiments may further include an input sensor TSU in comparison with the display device DS of the embodiment described with reference to FIG. 4. FIG. 18 is a cross-sectional view of a portion corresponding to the line II-II' of FIG. 3.

The display device DS-1 of an example embodiment shown in FIG. 18 includes a display panel DP and a display panel DP including a plurality of organic electroluminescent elements OEL-1, OEL-2, and OEL-3, and a color filter member CFP located on the color filter member CFP. In the description of the display device DS-1 of the embodiment shown in FIG. 18, the contents described with reference to FIGS. 1 to 10 may be identically applied to the display panel DP and the color filter member CFP.

In the display device DS-1 of an example embodiment, an input sensor TSU may be located between the display panel DP and the color filter member CFP. The input sensor TSU may recognize a user's direct touch, a user's indirect touch, a direct touch of an object, or an indirect touch of an object. Meanwhile, the input sensor TSU may detect at least one of the position and the intensity (pressure) of the touch applied from the outside. The input sensor TSU according to some example embodiments of the inventive concept may have various structures or may be formed of various materials, and the inventive concept is not limited to any one embodiment. For example, the input sensor TSU in the display device DS-1 according to some example embodiments may be a touch sensor that detects a touch.

The input sensor TSU may be located directly on the sealing member TFE of the display panel DP. That is, the input sensor TSU may be located directly on the display panel DP without a separate adhesive member.

The input sensor TSU may be located between the display panel DP and the color filter member CFP. According to some example embodiments, the color filter member CFP may be provided directly on the input sensor TSU.

Figure 19:
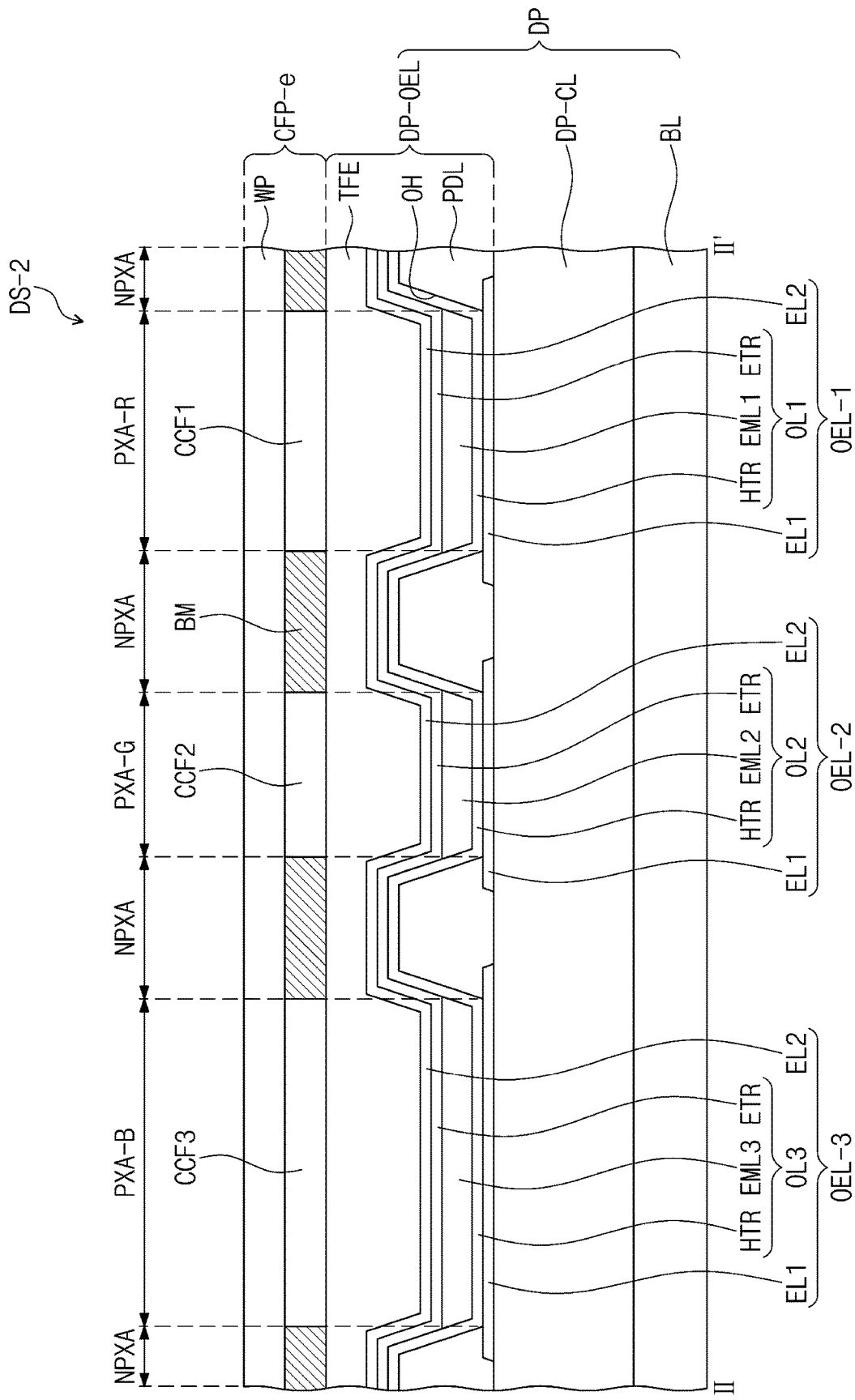
FIG. 19 is a cross-sectional view of a display device according to some example embodiments.
Figure 20:
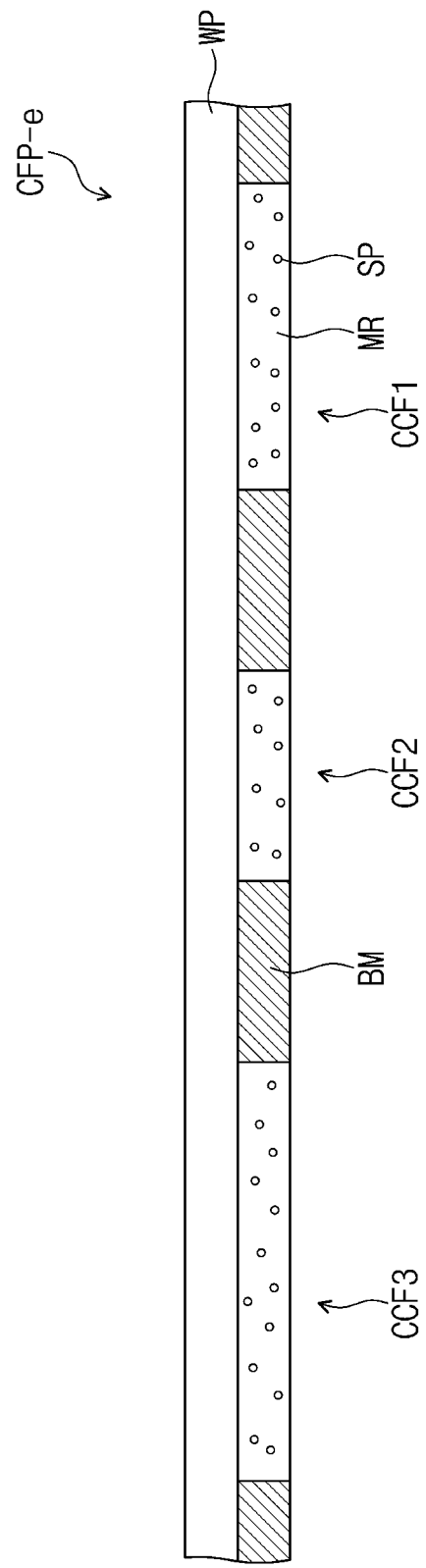
FIG. 20 is a cross-sectional view of a color filter according to some example embodiments.

FIG. 19 is a cross-sectional view showing a display device according to some example embodiments. FIG. 20 is a cross-sectional view of a color filter member CFP-e included in a display device of an example embodiment shown in FIG. 16. The display device DS-2 according to some example embodiments has some difference in the structure of the color filter member CFP-e as compared with the display device DS of the embodiment described with reference to FIG. 4. FIG. 19 is a cross-sectional view of a portion corresponding to the line II-II' of FIG. 3.

The display device DS-2 of an example embodiment shown in FIG. 19 includes a display panel DP and a display panel DP including a plurality of organic electroluminescent elements OEL-1, OEL-2, and OEL-3, and a color filter member CFP-c located on the color filter member CFP. The color filter member CFP-c may include a plurality of color filter portions CCF1, CCF2, and CCF3 and a light blocking portion BM.

In the description of the display device DS-2 of an example embodiment shown in FIG. 19, the contents described with reference to FIGS. 1 to 10 may be identically applied to the display panel DP, the color filter portions CCF1, CCF2, and CCF3, and the light blocking portion BM.

Referring to FIGS. 19 and 20, according to some example embodiments, the color filter member CFP-e may further include a base substrate WP. The base substrate WP may be located on the color filter portions CCF1, CCF2, and CCF3 and the light blocking portion BM. The base substrate WP may serve as a support substrate on which color filter portions CCF1, CCF2, and CCF3 and the light blocking portions BM are provided. The base substrate WP may be a glass substrate or a plastic substrate.

The base substrate WP may define the front of the display device DS-2. The base substrate WP may stably protect the internal components of the display device DS-2 including the color filter portions CCF1, CCF2, and CCF3 from external impacts.

Moreover, referring to FIGS. 19 and 20, in the color filter member CFP-c according to some example embodiments, the light blocking portion BM may be located between adjacent color filter portions CCF1, CCF2, and CCF3 and may not overlap the color filter portions CCF1, CCF2, and CCF3. However, the embodiments are not limited thereto, and unlike that shown in the drawing, in the color filter member CFP-c according to some example embodiments, the light blocking portion BM may at least partially overlap adjacent color filter portions CCF1, CCF2, and CCF3.

Moreover, in FIG. 19, each of the color filter portions CCF1, CCF2 and CCF3 may include a matrix portion MR and a scattering agent SP scattered in the matrix portion MR. However, the embodiments are not limited thereto, and the third color filter portion CCF3 corresponding to the blue emission area PXA-B may not include the scattering agent SP.

The display device according to some example embodiments may include a color filter member located on a display panel to reduce reflection due to external light while minimizing luminance reduction. Also, in a display device according to some example embodiments, at least one color filter portion among the plurality of color filter portions of the color filter member includes a scattering agent having a diameter of 50 nm or more and 500 nm or less to effectively scatter light while minimizing the haze value, so that it is possible to reduce the color difference according to the viewing angle and to display an improved display quality.

Further, some example embodiments may include a display panel and a color filter member, and the color filter member includes a plurality of color filter portions and an organic layer. By including a scattering agent having a diameter of 50 nm or more and 500 nm or less in a least one of a plurality of color filter portions and an organic layer, it is possible to provide a display device having improved processes when providing a color filter portion and a display device having improved display quality due to reduced color difference according to a viewing angle.

The display device according to some example embodiments may include a color filter member located on the display panel and includes a scattering agent in the color filter member to reduce the reflection due to external light while minimizing the luminance decrease and reduce the color difference according to the viewing angle.

Also, the display device according to some example embodiments may include a scattering agent in at least one of the color filter portions to improve the display quality difference according to the viewing angle.

Although aspects of some example embodiments of the inventive concept have been described, it is understood that the inventive concept should not be limited to these example embodiments but various changes and modifications may be made by one ordinary skilled in the art within the spirit and scope of the inventive concept as hereinafter claimed.

What is claimed is:

1. A display device comprising:
   a display panel including an organic electroluminescent element; and
   a color filter on the display panel,
   wherein the color filter comprises:
   a first color filter portion configured to transmit red light; and
   a second color filter portion configured to transmit green light,
   wherein the first color filter portion and the second color filter portion comprise a scattering agent having an average diameter of 50 nanometers (nm) or more and 500 nm or less,
   wherein a first content of the scattering agent included in the first color filter portion is greater than a second content of the scattering agent included in the second color filter portion.

2. The display device of claim 1, wherein the color filter further comprises a third color filter portion,
   wherein the third color filter portion comprises the scattering agent.

3. The display device of claim 2, wherein the third color filter portion is formed of a transparent photoresist resin.

4. The display device of claim 2, wherein the third color filter portion transmits blue light.

5. The display device of claim 2, wherein a third content of the scattering agent included in the third color filter portion.

6. The display device of claim 5, wherein the first content is greater than the third content.

7. The display device of claim 5, wherein the color filter further comprises an organic layer on the color filter portions, and a fourth content of the scattering agent in the organic layer is greater than each of the first to third contents.

8. The display device of claim 1, wherein a first content of the scattering agent included in the first color filter portion is more than 0 wt % and 10 wt % or less based on a total weight of the first color filter portion.

9. The display device of claim 1, wherein the scattering agent comprises at least one of $TiO_2$, ZnO, $Al_2O_3$, $SiO_2$, hollow silica, or polystyrene particles.

10. The display device of claim 1, wherein the color filter further comprises an organic layer on the color filter portions, wherein the organic layer comprises the scattering agent.

11. The display device of claim 10, wherein a content of the scattering agent in at least one color filter portion is more than 0 wt % and 10 wt % or less based on a total weight of the at least one color filter portion,
wherein a content of the scattering agent in the organic layer is 5 wt % or more and 50 wt % or less based on the total weight of the organic layer.

12. The display device of claim 1, wherein the color filter further comprises a light blocking portion between the color filter portions.

13. The display device of claim 1, wherein the display panel further comprises a sealing member on the organic electroluminescent element.

14. The display device of claim 13, wherein the color filter is directly on the sealing member.

15. The display device of claim 13, further comprising an input sensor between the sealing member and the color filter, wherein the color filter is directly on the input sensor.

16. The display device of claim 1, wherein the color filter further comprises a base substrate on the color filter portions.

17. The display device of claim 1, wherein a haze value in each of the color filter portions is 30% or less.

18. A display device comprising a red pixel region, a green pixel region, and a blue pixel region, the display device comprising:
a display panel; and
a color filter on the display panel,
wherein the color filter comprises:
a red color filter portion corresponding to the red pixel region;
a green color filter portion corresponding to the green pixel region;
a blue color filter portion corresponding to the blue pixel region; and
an organic layer on the red, green, and blue color filter portions,
wherein the red color filter portion and the green color filter portion comprise a scattering agent having an average diameter of 50 nanometers (nm) or more and 500 nm or less, and a content of the scattering agent included in the organic layer is greater than a content of the scattering agent included in each of the color filter portions.

19. The display device of claim 18, wherein the display panel is an organic light emitting display panel including:
a first light emitting layer corresponding to the red pixel region and emitting red light;
a second light emitting layer corresponding to the green pixel region and emitting green light; and
a third light emitting layer corresponding to the blue pixel region and emitting blue light.

20. A display device comprising:
an organic light emitting display panel; and
a color filter on the organic light emitting display panel and including a red color filter portion, a green color filter portion, and a blue color filter portion,
wherein each of the red color filter portion, the green color filter portion, and the blue color filter portion comprises a scattering agent having an average diameter of 50 nanometers (nm) or more and 500 nm or less,
wherein a content of the scattering agent in the red color filter portion is greater than a content of the scattering agent in each of the green color filter portion and the blue color filter portion.

21. A display device comprising:
a display panel including an organic electroluminescent element; and
a color filter on the display panel,
wherein the color filter comprises a plurality of color filter portions spaced from each other on a plane and an organic layer on the color filter portions,
wherein at least one of the color filter portions and the organic layer comprises a scattering agent having an average diameter of 50 nanometers (nm) or more and 500 nm or less,
wherein a content of the scattering agent in the organic layer is greater than a content of the scattering agent in each of the color filter portions.

22. The display device of claim 21, wherein the color filter comprises:
a first color filter portion configured to transmit red light;
a second color filter portion configured to transmit green light; and
a third color filter portion that is a transparent filter formed of a transparent photoresist resin or a blue filter that transmits blue light,
wherein the first color filter portion, the second color filter portion, and the organic layer comprise the scattering agent, and the third color filter portion does not comprise the scattering agent.

* * * * *